US 7,132,201 B2

(12) United States Patent
Yin et al.

(10) Patent No.: US 7,132,201 B2
(45) Date of Patent: Nov. 7, 2006

(54) TRANSPARENT AMORPHOUS CARBON STRUCTURE IN SEMICONDUCTOR DEVICES

(75) Inventors: Zhiping Yin, Boise, ID (US); Weimin Li, Shanghai (CN)

(73) Assignee: Micron Technology, Inc., Boise, ID (US)

( * ) Notice: Subject to any disclaimer, the term of this patent is extended or adjusted under 35 U.S.C. 154(b) by 5 days.

(21) Appl. No.: 10/661,379

(22) Filed: Sep. 12, 2003

(65) Prior Publication Data

US 2005/0059262 A1    Mar. 17, 2005

(51) Int. Cl.
*G01F 9/00* (2006.01)
*G03C 5/00* (2006.01)

(52) U.S. Cl. .............. 430/5; 430/22; 430/311
(58) Field of Classification Search .............. 430/5, 430/311; 427/249.7; 438/636; 378/35
See application file for complete search history.

(56) References Cited

U.S. PATENT DOCUMENTS

| | | | |
|---|---|---|---|
| H566 H | 1/1989 | Nyaiesh et al. ............. 427/571 |
| 4,849,642 A | 7/1989 | Katsumi ................. 250/492.2 |
| 4,971,853 A | 11/1990 | Chaiken et al. ............. 428/172 |
| 4,975,144 A | 12/1990 | Yamazaki et al. |
| 5,096,791 A | 3/1992 | Yahalom ....................... 430/5 |
| 5,198,263 A | 3/1993 | Stafford et al. ............. 427/577 |
| 5,324,365 A | 6/1994 | Niwa ......................... 136/256 |
| 5,346,729 A | 9/1994 | Pitts et al. .................. 427/582 |
| 5,358,880 A | 10/1994 | Lebby et al. ................ 438/26 |
| 5,369,040 A | 11/1994 | Halvis et al. ................. 437/3 |
| 5,420,043 A | 5/1995 | Kaisha ......................... 437/4 |
| 5,431,800 A | 7/1995 | Kirchhoff ................... 204/290 |
| 5,437,961 A | 8/1995 | Yano et al. ................. 430/316 |
| 5,470,661 A | 11/1995 | Bailey et al. |
| 5,496,752 A | 3/1996 | Nasu et al. ................... 437/41 |
| 5,514,885 A | 5/1996 | Myrick ....................... 257/216 |
| 5,578,501 A | 11/1996 | Niwa ............................ 437/2 |
| 5,589,307 A | 12/1996 | Tacheuchi .................... 430/49 |
| 5,629,532 A | 5/1997 | Myrick ........................ 257/77 |
| 5,669,644 A | 9/1997 | Kaihotsu et al. ............. 294/1.1 |
| 5,723,029 A | 3/1998 | Shimoyama ................ 204/242 |
| 5,733,713 A | 3/1998 | Yano et al. ................. 430/316 |
| 5,750,316 A | 5/1998 | Kawamura et al. ......... 430/311 |
| 5,800,878 A | 9/1998 | Yao |
| 5,830,332 A * | 11/1998 | Babich et al. ......... 204/192.15 |
| 5,998,100 A | 12/1999 | Azuma |
| 6,035,803 A | 3/2000 | Robles et al. |

(Continued)

FOREIGN PATENT DOCUMENTS

EP    0531232 A2    3/1993

(Continued)

OTHER PUBLICATIONS

"International Search Report, for Application No. PCT/US2004/029172, date mailed Dec. 21, 2004", 15 pages.

(Continued)

*Primary Examiner*—S. Rosasco
(74) *Attorney, Agent, or Firm*—Schwegman, Lundberg, Woessner & Kluth, P.A.

(57) ABSTRACT

A transparent amorphous carbon layer is formed. The transparent amorphous carbon layer has a low absorption coefficient such that the amorphous carbon is transparent in visible light. The transparent amorphous carbon layer may be used in semiconductor devices for different purposes. The transparent amorphous carbon layer may be included in a final structure in semiconductor devices. The transparent amorphous carbon layer may also be used as a mask in an etching process during fabrication of semiconductor devices.

40 Claims, 18 Drawing Sheets

U.S. PATENT DOCUMENTS

| | | | |
|---|---|---|---|
| 6,107,734 A | 8/2000 | Taneka et al. | 313/506 |
| 6,128,868 A | 10/2000 | Ohtsuka et al. | 52/173.3 |
| 6,136,160 A | 10/2000 | Hrkut et al. | 204/192.16 |
| 6,140,570 A | 10/2000 | Kariya | 136/256 |
| 6,140,652 A | 10/2000 | Shlepr et al. | 250/440.11 |
| 6,211,065 B1 | 4/2001 | Xi et al. | |
| 6,221,535 B1 | 4/2001 | Cox et al. | 430/1 |
| 6,291,334 B1 | 9/2001 | Somekh | |
| 6,300,631 B1 | 10/2001 | Shofner | 250/311 |
| 6,313,896 B1* | 11/2001 | Samant et al. | 349/124 |
| 6,316,329 B1 | 11/2001 | Hirota et al. | |
| 6,323,119 B1 | 11/2001 | Xi et al. | |
| 6,331,380 B1 | 12/2001 | Ye et al. | |
| 6,346,184 B1 | 2/2002 | Sano et al. | 205/199 |
| 6,350,997 B1 | 2/2002 | Saeki | 257/102 |
| 6,394,109 B1 | 5/2002 | Somekh | 134/39 |
| 6,420,095 B1 | 7/2002 | Kawamura et al. | 430/313 |
| 6,423,384 B1 | 7/2002 | Khazeni et al. | |
| 6,427,703 B1 | 8/2002 | Somekh | 134/1.1 |
| 6,444,899 B1 | 9/2002 | Kubota et al. | 136/256 |
| 6,447,891 B1* | 9/2002 | Veerasamy et al. | 428/216 |
| 6,461,950 B1 | 10/2002 | Yin et al. | |
| 6,483,127 B1 | 11/2002 | Saeki | 257/96 |
| 6,508,911 B1 | 1/2003 | Han et al. | |
| 6,541,397 B1 | 4/2003 | Bencher | |
| 6,551,941 B1 | 4/2003 | Yang et al. | |
| 6,566,757 B1 | 5/2003 | Banerjee | |
| 6,573,030 B1 | 6/2003 | Fairbairn et al. | |
| 6,583,481 B1 | 6/2003 | Itoh | 257/433 |
| 6,613,603 B1 | 9/2003 | Sano | 438/72 |
| 6,621,535 B1 | 9/2003 | Fukada | 349/40 |
| 6,624,064 B1 | 9/2003 | Sahin et al. | |
| 6,627,532 B1 | 9/2003 | Gaillard | |
| 6,649,469 B1 | 11/2003 | Wilson | 438/253 |
| 6,653,735 B1 | 11/2003 | Yang et al. | |
| 6,668,752 B1 | 12/2003 | Yao | |
| 6,780,753 B1 | 8/2004 | Latchford et al. | |
| 6,784,119 B1 | 8/2004 | Gaillard et al. | |
| 6,795,636 B1 | 9/2004 | Cronk et al. | |
| 6,803,313 B1 | 10/2004 | Gao et al. | |
| 6,821,571 B1 | 11/2004 | Huang | |
| 6,825,114 B1 | 11/2004 | Fisher et al. | |
| 6,841,341 B1 | 1/2005 | Fairbairn et al. | |
| 6,852,647 B1 | 2/2005 | Bencher | |
| 6,864,556 B1* | 3/2005 | You et al. | 257/437 |
| 6,875,664 B1 | 4/2005 | Huang et al. | |
| 6,875,687 B1 | 4/2005 | Weidman | |
| 6,884,733 B1 | 4/2005 | Dakshina-Murthy et al. | |
| 2001/0006837 A1 | 7/2001 | Kwon et al. | |
| 2001/0011730 A1 | 8/2001 | Saeki | 257/79 |
| 2001/0017153 A1 | 8/2001 | Kubota et al. | 136/256 |
| 2002/0001778 A1 | 1/2002 | Latchford et al. | |
| 2002/0003239 A1 | 1/2002 | Ramdani et al. | 257/190 |
| 2002/0086547 A1 | 7/2002 | Mui et al. | |
| 2002/0100696 A1 | 8/2002 | Sano et al. | 205/333 |
| 2003/0198814 A1 | 10/2003 | Khieu et al. | |
| 2003/0207207 A1 | 11/2003 | Li | |
| 2004/0092098 A1 | 5/2004 | Sudijono et al. | |
| 2005/0056835 A1 | 3/2005 | Yin et al. | |
| 2005/0056940 A1 | 3/2005 | Sandhu et al. | |
| 2006/0001175 A1 | 1/2006 | Sandhu | |
| 2006/0003237 A1 | 1/2006 | Yin et al. | |

FOREIGN PATENT DOCUMENTS

| | | |
|---|---|---|
| EP | 1154468 A2 | 11/2001 |
| JP | 58-204534 A | 11/1983 |
| WO | WO-03038875 A2 | 5/2003 |
| WO | WO-2004/012246 A2 | 2/2004 |
| WO | WO-2005/034216 A1 | 4/2005 |
| WO | WO-2005/034229 A1 | 4/2005 |

OTHER PUBLICATIONS

Liu, W., et al., "Generating Sub-30nm Poly-Silicon Gates Using PECVD Amorphous Carbon as Hardmask and Anti-Reflective Coating", *Proceedings of the SPIE*, 5040, Optical Microlithography XVI, Yen, A, (ed.),(Feb. 25, 2003),841-848.

Shieh, J. -., et al., "Characteristics of Fluorinated Amorphous Carbon Films and Implementation of 0.15 micron Cu/a-C:F Damascene Interconnection", *Journal of Vacuum Science and Technology*, 19, (May 2001),780-787.

Pelton, Matthew, et al., "The optical absorption edge of diamond-like carbon: A quantum well model", *Journal of Applied Physics*, 83(2), (Jan. 15, 1998),1029-35.

Chen, Z. Y., et al., "Optical Constants of Tetrahedral Amorphous Carbon Films in the Infrared Region and at a Wavelength of 633 nm", *Journal of Applied Physics*, vol. 87 (9), American Institute of Physics,(May 1, 2000),4268.

He, X., et al., "Characterization and Optical Properties of Diamond-like Carbon Prepared by Electron Cyclotron Resonance Plasma", Journal of Materials Research, vol. 14 (3),(Mar. 1999),1055.

Lide, D. R., et al., "Physical Constants of Organic Compounds", *CRC Handbook of Chemistry and Physics, Internet Version 2005*, http://www.hbcpnetbase.com, (2005),12-157.

Zhou, X. T., et al., "Deposition and Properties of a-C:H films on Polymethyl Methacrylate by electron Cyclotron Resonance Microwave Plasma Chemical Vapor Deposion Method", *Surface and Coatings Technology*, 123, www.elsevier.nl/locate.surfcoat,(2000),273-277.

\* cited by examiner

TRANSPARENT AMORPHOUS CARBON STRUCTURE IN SEMICONDUCTOR DEVICES

RELATED APPLICATIONS

This application is related to the following co-pending and commonly assigned application; application Ser. No. 10/661,100, filed Sep. 12, 2003, entitled "MASKING STRUCTURE HAVING MULTIPLE LAYERS INCLUDING AN AMORPHOUS CARBON LAYER" which is hereby incorporated by reference.

FIELD OF INVENTION

The present invention relates generally to semiconductor devices, more particularly to masking structures in the semiconductor devices.

BACKGROUND

Semiconductor devices such as memory devices reside in many computers and electronic products to store data. A typical semiconductor device has many layers of different materials formed on a semiconductor wafer.

During manufacturing, the layers go through many processes. For example, a patterning process puts patterns on the layers. Some patterning processes use a mask to transfer patterns from the mask to the layers underneath the mask.

Some conventional masks are made of amorphous carbon. However, an amorphous carbon mask at some thickness may have a high absorption of optical light, causing the amorphous carbon mask inapplicable for some processes.

SUMMARY OF THE INVENTION

The present invention provides devices having a masking structure and techniques for forming the masking structure. The masking structure includes an amorphous carbon layer having a low absorption property. The amorphous layer is transparent in visible light range of the electromagnetic radiation.

DETAILED DESCRIPTION OF THE EMBODIMENTS

Figure 1A:
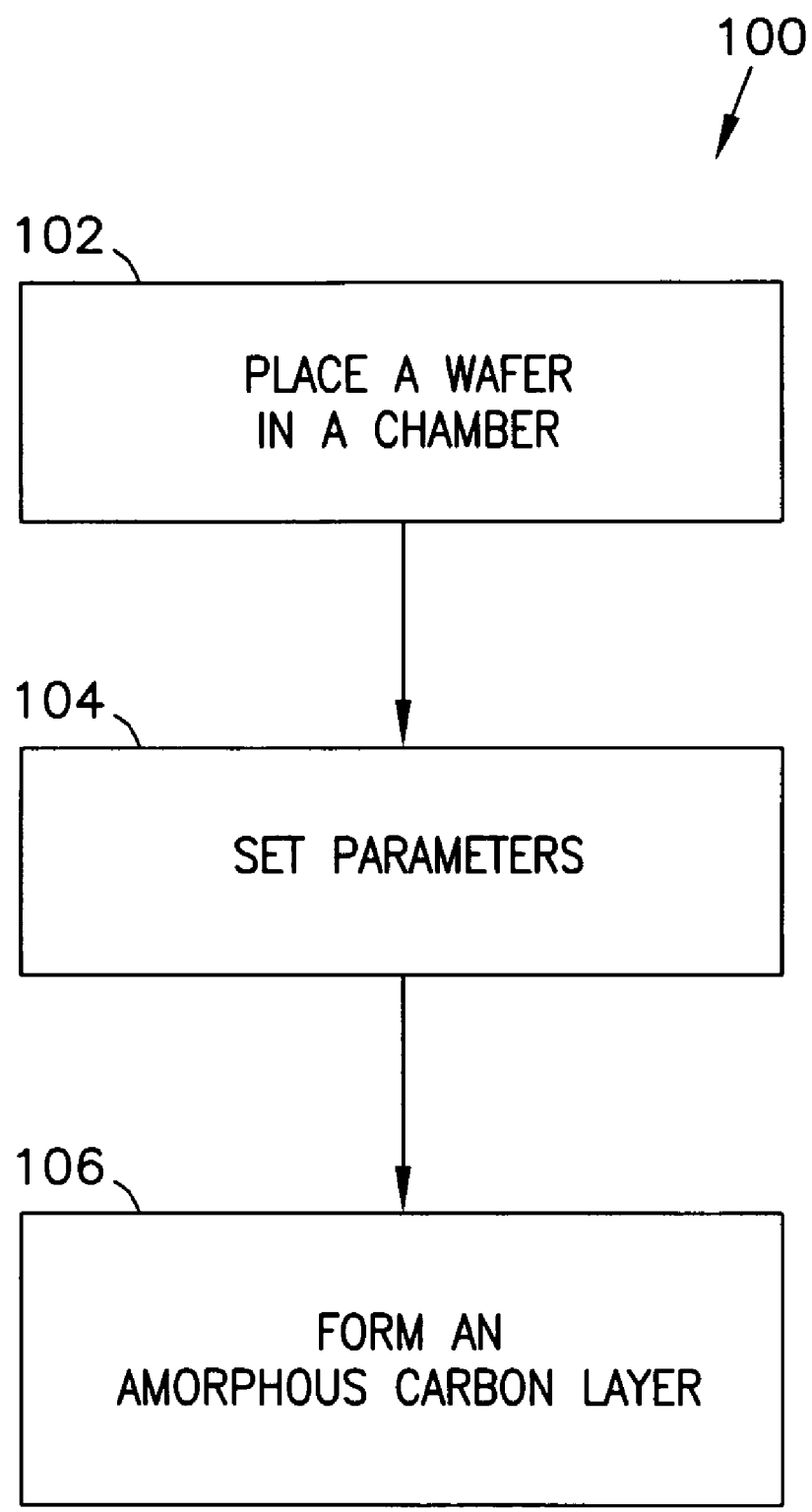
FIG. 1A is a flow chart showing a method of forming an amorphous carbon layer according an embodiment of the invention.

The following description and the drawings illustrate specific embodiments of the invention sufficiently to enable those skilled in the art to practice the invention. Other embodiments may incorporate structural, logical, electrical, process, and other changes. In the drawings, like numerals describe substantially similar components throughout the several views. Examples merely typify possible variations. Portions and features of some embodiments may be included in or substituted for those of others. The scope of the invention encompasses the full ambit of the claims and all available equivalents.

FIG. 1A is flowchart showing a method of forming an amorphous carbon layer according to an embodiment of the invention. Method 100 forms an amorphous carbon layer having a low absorption coefficient such that the amorphous carbon layer is transparent in visible light range.

The visible light range is the range (optical range) of the electromagnetic spectrum having light (electromagnetic radiation) visible to human eyes. The visible light range includes any light having a wavelength between about 400 nm (nanometers) and about 700 nm. The non-visible light range is the range of the entire electromagnetic spectrum minus the visible light range. Some examples of the non-visible light range include electromagnetic radiations with wavelengths between 700 nm and one millimeter (infrared light), wavelengths between 10 nm and 400 nm (ultraviolet light), and wavelengths between 0.01 nm and 10 nm (X-ray).

In this specification, the amorphous carbon layer is transparent in visible light range means that the amorphous carbon layer has a substantially low absorption coefficient (k) in which k has a range between about 0.15 and about 0.001 at wavelength of 633 nm. In some embodiments, the amorphous carbon layer transparent in visible light range is an amorphous carbon layer formed at a temperature from about 200° C. to about 500° C. such that the amorphous carbon layer has an absorption coefficient (k) between about 0.15 and about 0.001 at wavelength of 633 nm.

At box 102 of method 100 in FIG. 1A, a wafer is placed in a chamber. In some embodiments, the chamber is a chemical vapor deposition chamber and the wafer is a semiconductor wafer. In embodiments represented by FIG. 1A, the chamber is a plasma enhanced chemical vapor deposition (PECVD) chamber.

At box 104, the parameters are set for the process of forming an amorphous carbon layer according to the invention. The parameters include temperature, gas mixture, gas flow rate, power, and pressure. The temperature in the chamber is set to a selected temperature. The selected temperature is any temperature from about 200° C. to about 500° C. In some embodiments, the temperature is set between about 200° C. and below 300° C. In other embodiments, the temperature is set between about 225° C. and about 375° C.

In the process of forming an amorphous carbon layer, a process gas including propylene ($C_3H_6$) is introduced into the chamber at a flow rate. In some embodiments, the flow rate of the propylene is set between about 500 standard cubic centimeters per minute (sccm) and about 3000 sccm. An additional gas including helium may be also introduced into the chamber at a flow rate. In some embodiments, the flow rate of the helium is set between about 250 sccm and about 1000 sccm. Further, embodiments exist where at least one of the other hydrocarbon gases is used as the process gas. Examples of the other hydrocarbon gases include $CH_4$, $C_2H_2$, $C_2H_4$, $C_2H_6$, and $C_3H_8$. Helium may also be used in combination with at least one of these hydrocarbon gases. Thus, in box 104, a gas mixture is introduced into the chamber.

In this specification, the gas mixture may be either one gas only or a combination of at least two gases. For example, the gas mixture may be either propylene ($C_3H_6$) only or a combination of propylene and helium. As another example, the gas mixture may be at least one of the propylene, $CH_4$, $C_2H_2$, $C_2H_4$, $C_2H_6$, and $C_3H_8$. As a further example, the gas mixture may be at least one of the propylene, $CH_4$, $C_2H_2$, $C_2H_4$, $C_2H_6$, and $C_3H_8$ plus helium.

During the process of forming the amorphous carbon layer in method 100, the chamber is subjected to a radio frequency (RF) power and a pressure. In some embodiments, the radio frequency power is set between about 450 Watts and about 1000 Watts, and the pressure is set between about 4 Torr and about 6.5 Torr.

In box 106, an amorphous carbon layer is formed as a deposited layer over the wafer. The amorphous carbon layer is transparent in visible light range. In some embodiments, the amorphous carbon layer formed by method 100 has an absorption coefficient (k) between about 0.15 and about 0.001 at wavelength of 633 nm.

Since the amorphous carbon layer formed by method 100 is transparent in visible light range, the amorphous carbon layer formed by method 100 is also referred to as a transparent amorphous carbon layer. Thus, the transparent amorphous carbon layer refers to an amorphous carbon layer formed according method 100 in which the temperature is set from about 200° C. to about 500° C.

The transparency of the amorphous carbon layer formed by method 100 depends in part on the temperature set during the process. In method 100, the transparency of the amorphous carbon layer formed to a specific thickness at a lower temperature is more transparent than the amorphous carbon layer formed to that specific thickness at a higher temperature. For example, in method 100, the amorphous carbon layer formed to a thickness at 200° C. is more transparent than the amorphous carbon layer formed to the same thickness at 500° C.

The transparent amorphous carbon layer formed by method 100 may be used in semiconductor devices such as memory devices and microprocessors. For example, the transparent amorphous carbon layer formed by method 100 may be included in a structure of semiconductor devices as an insulating layer or an antireflective layer. As another example, the transparent amorphous carbon layer formed by method 100 may also be used as a mask in an etching process during manufacturing of semiconductor devices.

Figure 1B:
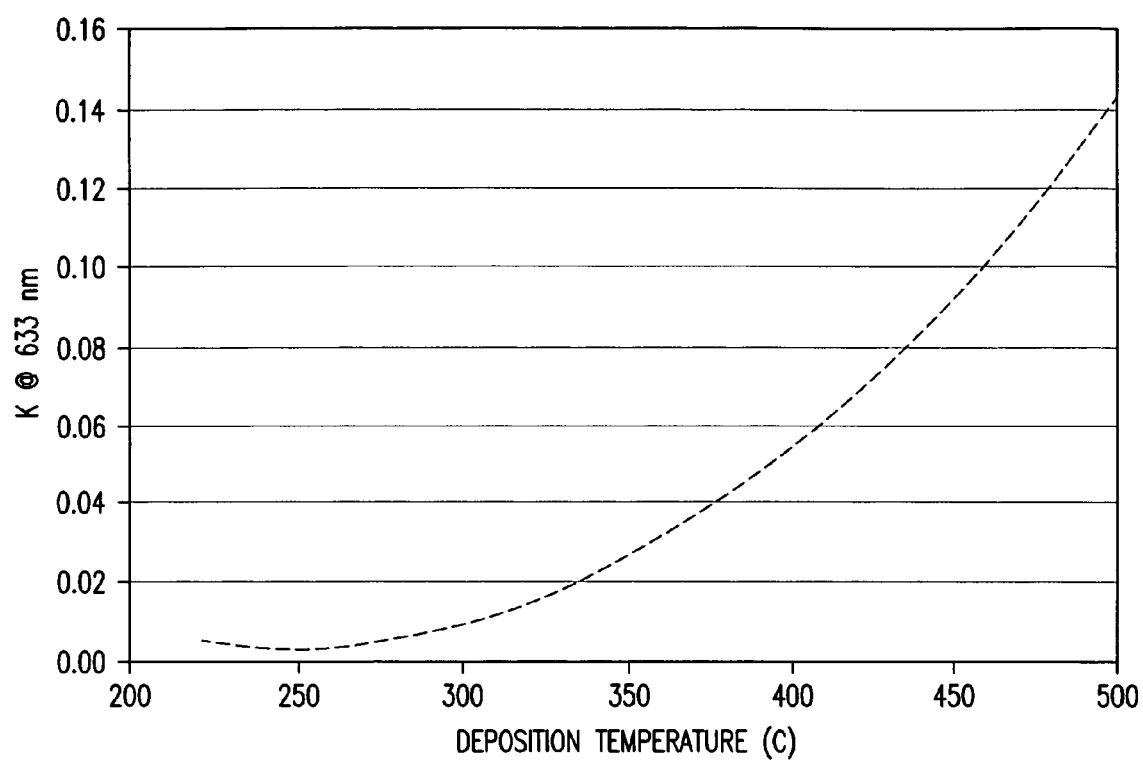
FIG. 1B is graph showing an absorption coefficient (k) at an exemplary wavelength versus deposition temperature of a transparent amorphous carbon layer according to an embodiment of the invention.

FIG. 1B is graph showing an absorption coefficient (k) at an exemplary wavelength versus deposition temperature of a transparent amorphous carbon layer according to an embodiment of the invention. In some embodiments, the graph of FIG. 1B shows the absorption coefficient of the transparent amorphous carbon layer formed according to the method described in FIG. 1A.

In FIG. 1B, curve 150 shows the transparent amorphous layer having an absorption coefficient k ranging from about 0.15 to about 0.001 at wavelength of 633 nm when the transparent amorphous layer is formed (or deposited) at a temperature from about 200° C. to about 500° C. In FIG. 1B, curve 150 has an exemplary shape. In some embodiments, curve 150 may have a shape different from the shape shown in FIG. 1B.

Figure 1C:
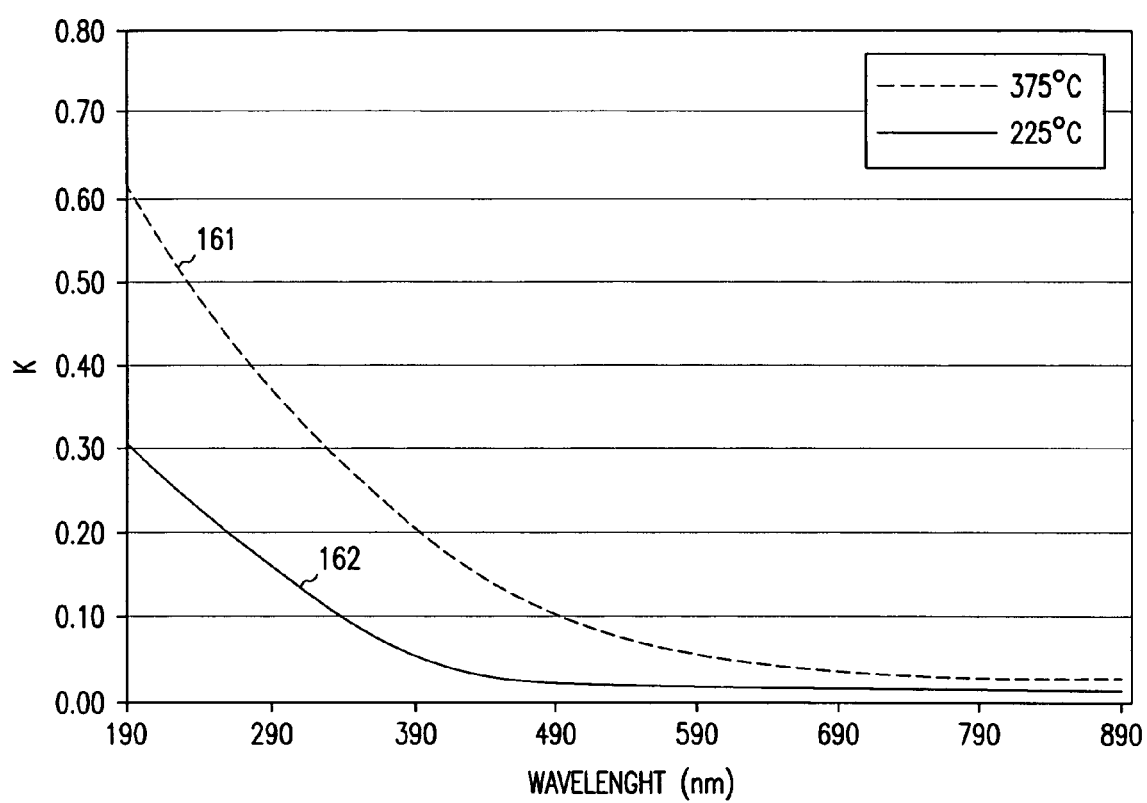
FIG. 1C is graph showing an absorption coefficient (k) at exemplary temperatures versus range of wavelengths of a transparent amorphous carbon according to an embodiment of the invention.

FIG. 1C is graph showing absorption coefficient (k) at exemplary temperatures versus a range of wavelengths of a transparent amorphous carbon according to an embodiment of the invention. In some embodiments, the graph of FIG. 1C shows the absorption coefficient of the transparent amorphous carbon layer formed according to the method described in FIG. 1A.

In FIG. 1C, curve 161 shows absorption coefficient (k) versus a range of wavelengths of a transparent amorphous carbon formed at an exemplary temperature of 375° C. Curve 162 shows absorption coefficient versus a range of wavelengths of another transparent amorphous carbon formed at an exemplary temperature of 225° C.

Figure 1D:
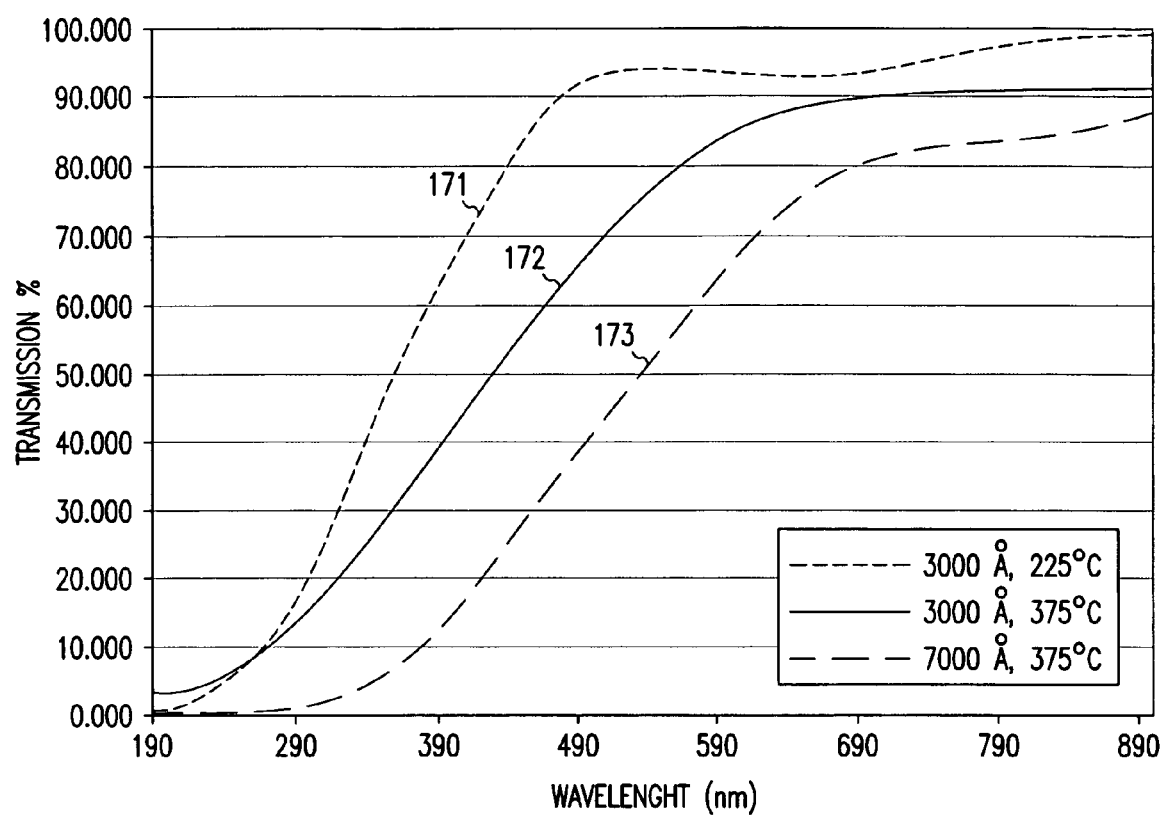
FIG. 1D is graph showing a transmission percentage versus a range of wavelengths of several transparent amorphous carbon layers at exemplary temperatures and exemplary thicknesses according to an embodiment of the invention.

FIG. 1D is graph showing transmission percentage versus a range of wavelengths of several transparent amorphous carbon layers at exemplary temperatures and exemplary thicknesses according to an embodiment of the invention. In some embodiments, the graph of FIG. 1D shows exemplary transmission percentages of the transparent amorphous carbon layer formed according to the method described in FIG. 1A.

In FIG. 1D, curves 171, 172, and 173 show transmission percentage versus a range of wavelengths for three different amorphous carbon layers formed to different thicknesses at different temperatures. Curve 171 shows transmission percentage versus a range of wavelengths of a transparent amorphous carbon layer formed to a thickness of 3000 Angstroms at a temperature of 225° C. Curve 172 shows transmission percentage versus the range of wavelengths of a transparent amorphous carbon layer formed to a thickness of 3000 Angstroms at a temperature of 375° C. Curve 173 shows transmission percentage versus the range of wavelengths of a transparent amorphous carbon layer formed to a thickness of 7000 Angstroms at a temperature of 375° C. FIG. 1D shows that the transmission increases when the thicknesses, or the temperature, or both decreases.

Figure 1E:
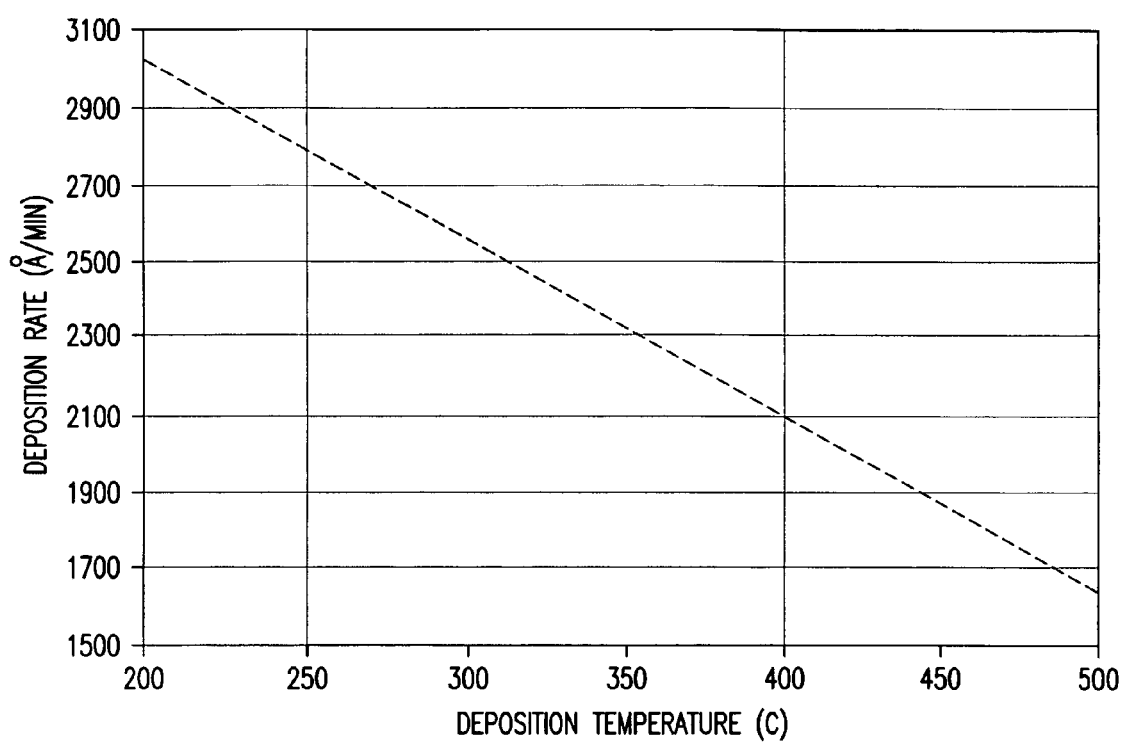
FIG. 1E is graph showing an exemplary deposition rate versus a temperature range of a method of forming a transparent amorphous carbon layer according to an embodiment of the invention.

FIG. 1E is graph showing exemplary deposition rate versus a temperature range of a method of forming a transparent amorphous carbon layer according to an embodiment of the invention. In some embodiments, the graph of FIG. 1E shows exemplary deposition rate of the transparent amorphous carbon layer formed according to the method described in FIG. 1A. FIG. 1E shows that the deposition rate is inversely proportional to the temperature. For example, at a temperature of 250° C., the deposition rate is about 2800 Angstroms per minute. As another example, at a temperature of 400° C., the deposition rate is about 2100 Angstroms per minute.

FIG. 2 through FIG. 10 show a device 200 during various processing stages according to embodiments of the invention.

Figure 2:
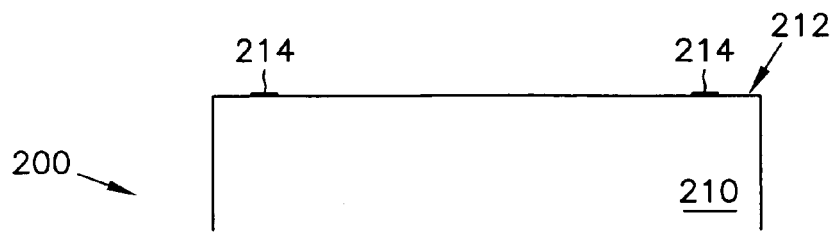
FIG. 2 through FIG. 10 show cross-sections of a device during various processing stages according to embodiments of the invention.

FIG. 2 shows a cross-section of a device 200 including a substrate 210. Substrate 210 may represent a part of a wafer, or may be a wafer itself. The wafer may be a semiconductor wafer such as a silicon wafer. Substrate 210 may also be a structure or a layer formed on a wafer. Substrate 210 may include at least one of a non-conducting material, a conducting material, and a semiconducting material. Examples of non-conducting materials include oxide (e.g., $SiO_2$, Al$_2$O$_3$), nitride (e.g., Si$_3$N$_4$), and glass (borophosphosilicate glass-BPSG). Examples of conducting materials include aluminum, tungsten, other metals, and compound of metals. Examples of semiconducting materials include silicon, and silicon doped with other materials such as boron, phosphorous, and arsenic. In embodiments represented by FIG. 2, substrate 210 includes a semiconductor material.

Substrate 210 has a surface 212 in which alignment marks 214 are formed. Alignment marks 214 serves as reference points or coordinates of substrate (wafer) 210. During an alignment process, the alignment marks 214 are used to align or position substrate 210 such that structures and layers on substrate 210 can be accurately aligned with each other or with substrate 210.

Figure 3:
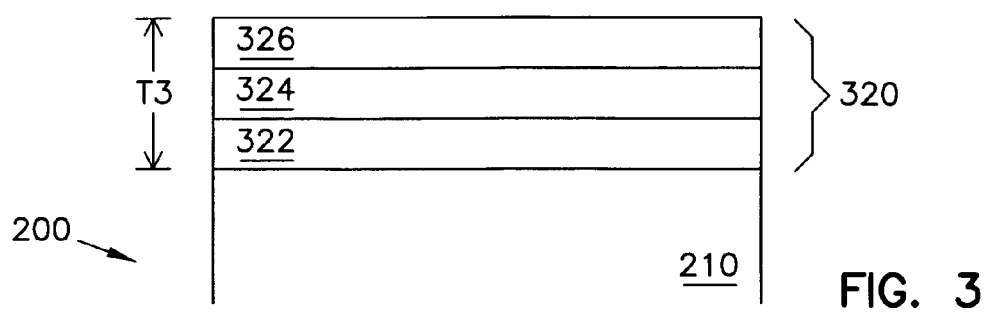

FIG. 3 shows device 200 with a device structure 320 formed over substrate 210. Device structure 320 includes multiple layers 322, 324, and 326. Each of these multiple layers may include at least one of a non-conducting material, semiconducting material, and a conducting material. For example, layer 322 may be an oxide layer; layer 324 may be a metal layer or a layer having a compound of metal and silicon; and layer 326 may be a nitride layer. In some embodiments, multiple layers 322, 324, and 326 are arranged in an order different from the order shown in FIG. 3. Multiple layers 322, 324, and 326 are formed by growing or deposition or by other known processes. In some embodiments, one or more of the layers 322, 324, and 326 is omitted from device structure 320. In other embodiments, one or more additional layers similar to layers 322, 324, and 326 are added to device structure 320. Device structure 320 has a thickness T3. In some embodiments, T3 is at least 40000 Angstroms.

Figure 4A:
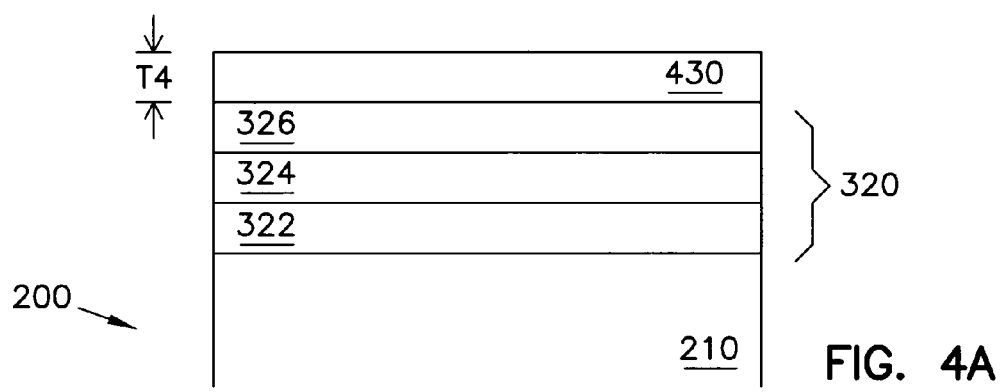

FIG. 4A shows device 200 with a mask (layer) 430 formed over device structure 320. Mask 430 is made of carbon. In embodiments represented by FIG. 4A, the carbon is amorphous carbon. Thus, in FIG. 4A, mask 430 is also referred to as amorphous carbon layer 430. Amorphous carbon layer 430 may be formed by a method similar to method 100 described in FIG. 1A.

Amorphous carbon layer 430 has a thickness T4. T4 can be any thickness. In some embodiments, T4 is at least 4000 Angstroms. Amorphous carbon layer 430 has a low absorption coefficient such that amorphous carbon layer 430 is transparent in visible light range. In some embodiments, amorphous carbon layer 430 has an absorption coefficient (k) between about 0.15 and about 0.001 at wavelength of 633 nm.

Since amorphous carbon layer 430 is transparent in visible light range, amorphous carbon layer 430 does not substantially absorb or reflect the light in the visible light range. Therefore, the transparency in visible light range property of amorphous carbon layer 430 improves the reading of alignment marks 214 (FIG. 2) on substrate 210 during the alignment of substrate 210. Further, since amorphous carbon layer 430 is transparent in visible light range, the thickness of amorphous carbon layer 430 may not be limited. Thus, amorphous carbon layer 430 may be formed with a thickness to properly etch device structure 320 while allowing an accurate reading of the alignment marks such as alignment marks 214.

In comparing amorphous carbon layer 430 with a conventional amorphous carbon layer having a higher absorption coefficient (or less transparent) than that of amorphous carbon layer 430, the conventional amorphous carbon may have a thickness limitation for some processes. For example, some process may require a mask with a specific thickness, using a conventional amorphous carbon layer with the specific thickness may cause difficulty in reading the alignment marks or may result in inaccurate reading because of the high absorption property of the conventional amorphous carbon layer. Therefore, because of the low absorption property, amorphous carbon layer 430 is useful in processes that may require a mask with a specific thickness in which a conventional amorphous carbon mask is unsuitable.

Amorphous carbon layer 430 of device 200 is formed with a thickness sufficient to properly etch a device structure such as device structure 320. For example, amorphous carbon layer 430 is formed with thickness T4 equal to or greater than about 4000 Angstroms to etch device structure 320 with thickness T3 equal to or greater than 40000 Angstroms.

Figure 4B:
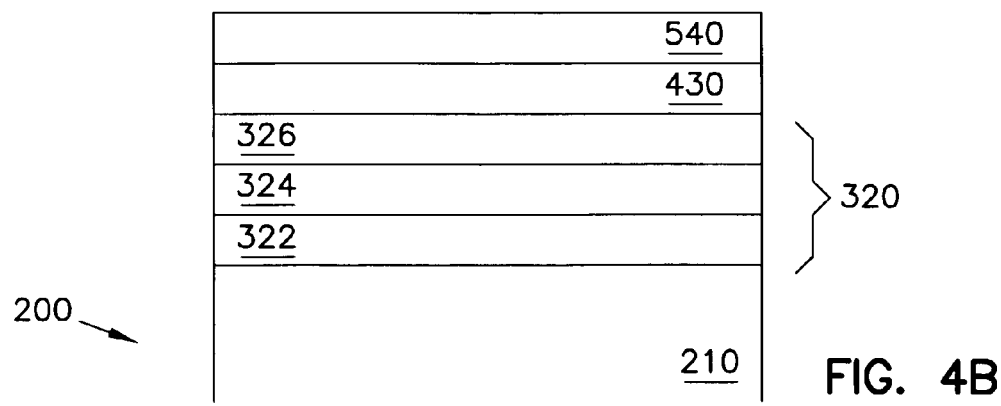

FIG. 4B shows device 200 with a cap layer 540 formed over amorphous carbon layer 430. In some embodiments, cap layer 540 includes oxide materials. In other embodiments, cap layer 540 includes non-oxide materials. In FIG. 4B, cap layer 540 includes silicon oxynitride (Si$_x$O$_y$N$_z$) or silicon-rich oxide (Si$_x$O$_y$) where x, y, and z are real numbers. In some embodiments, cap layer 540 includes hydrogenated silicon oxynitride (Si$_x$O$_y$N$_z$:H) or hydrogenated silicon-rich oxide (Si$_x$O$_y$:H).

Cap layer 540 can be formed by a deposition process such as a CVD and PECVD process. In some embodiments, cap layer 540 is formed together with amorphous carbon layer 430 in the same process (same processing step) such that cap layer 540 is situ deposited over amorphous carbon layer 430.

Figure 5:
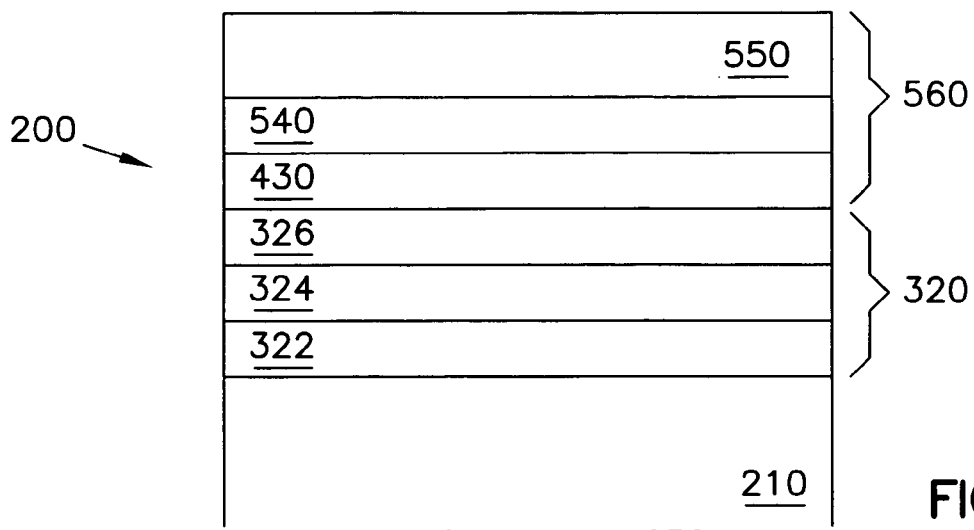

FIG. 5 shows device 200 with a photoresist layer 550 formed over cap layer 540 and amorphous carbon layer 430. Photoresist 550 is formed using known techniques. In some embodiments, cap layer 540 serves as an antireflective layer for reducing the reflection to photoresist layer 550 from layers underneath amorphous carbon layer 430 during patterning of photoresist layer 550. Reducing the reflection allows more accurate patterning of photoresist layer 550. In other embodiments, cap layer 540 serves as a mask for patterning amorphous carbon layer 430. In some other embodiments, cap layer 540 serves as both an antireflective layer and as a mask.

The combination of amorphous carbon layer 430, cap layer 540, and photoresist layer 550 forms a masking structure 560. In some embodiments, cap layer 540 is omitted from masking structure 560. In other embodiments, besides amorphous carbon layer 430, cap layer 540, and photoresist layer 550, masking structure 560 further includes an additional layer formed between photoresist layer 550 and cap layer 540. The additional layer serves as an antireflective layer to further enhance the photo processing performance.

Figure 6:
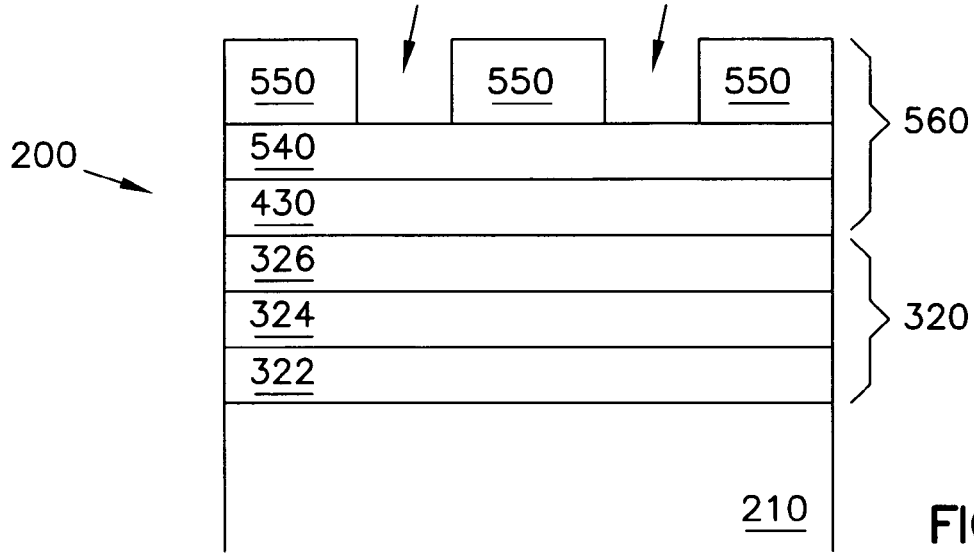

FIG. 6 shows device 200 after photoresist layer 550 is patterned. Patterning photoresist layer 550 can be performed using known techniques. In FIG. 6, patterned photoresist layer 550 has openings 652. Patterned photoresist layer 550 is used as a mask to pattern cap layer 540 and amorphous carbon layer 430.

Figure 7:
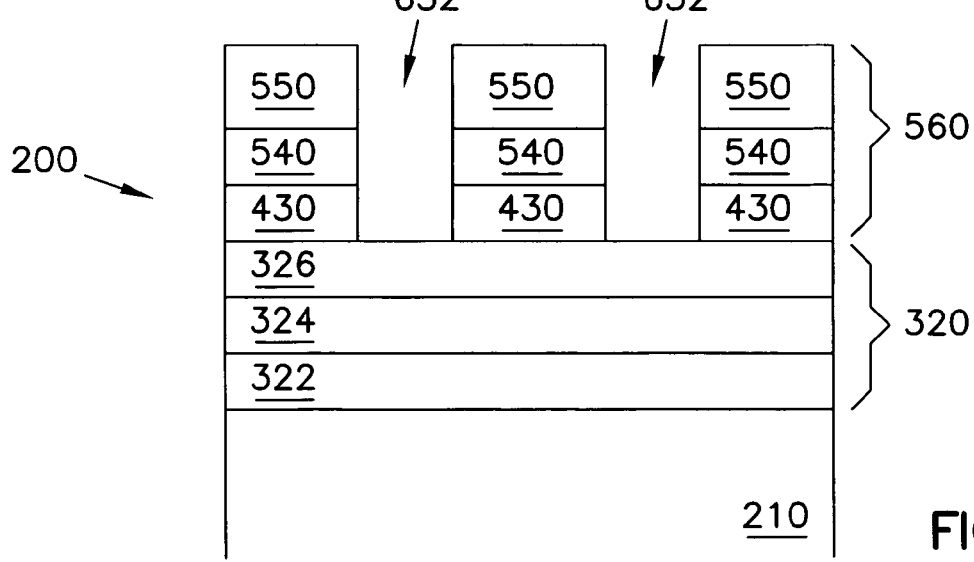

FIG. 7 shows device 200 after the masking structure 560 is patterned. Patterning masking structure 560 can be performed by one or more etching steps. In some embodiments, cap layer 540 and amorphous carbon layer 430 are etched together in one etching step. In other embodiments, cap layer 540 and amorphous carbon layer 430 are etched separately in different etching steps. As shown in FIG. 7, each of the patterned cap layer 540 and the patterned amorphous carbon layer 430 has openings that are continuous and aligned with openings 652 of photoresist layer 550. In some embodiments, after amorphous carbon layer 430 is patterned, the combination of layers 430, 540, and 550 of masking structure 560 may remain and is used as a mask to etch the layers of device structure 320. In other embodiments, after amorphous carbon layer 430 is patterned, either photoresist layer 550 or a combination of both photoresist layer 550 and cap layer 540 is removed. The remaining (not removed) layer, or layers, of masking structure 560 is used as a mask to etch one or both of device structure 320 and substrate 210.

Figure 8:
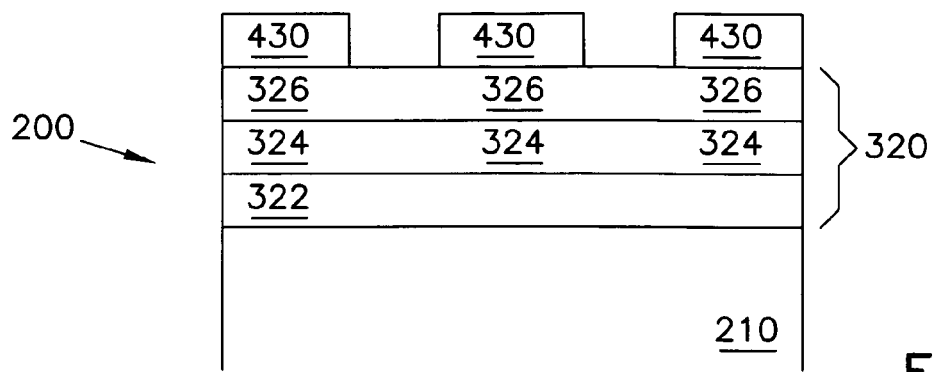
Figure 9:
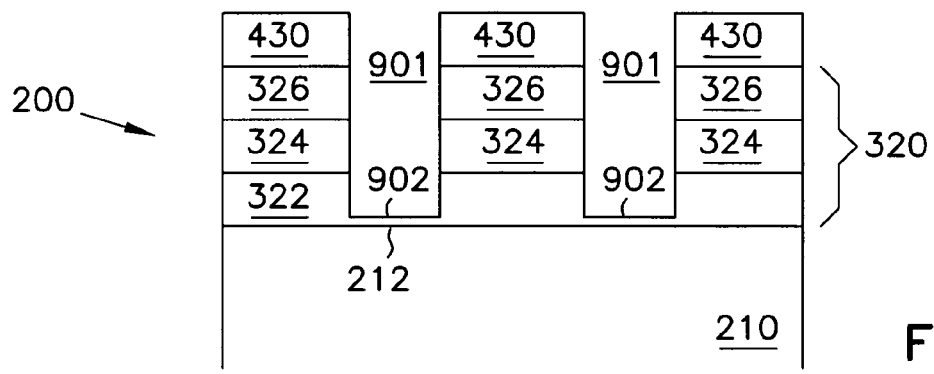

FIG. 8 shows device 200 after both photoresist layer 550 and cap layer 540 are removed. In this example, the remaining amorphous carbon layer 430 is used as a mask to etch either a portion of device structure 320, or the entire device structure 320. In some embodiments, at least a portion of substrate 210 is also etched using amorphous carbon layer 430 as a mask FIG. 9 shows device 200 after device structure 320 is etched. Trenches 901 are formed as a result of the etching process. In embodiments represented by FIG. 9, trenches 901 are formed in at least portion of device structure 320. In some embodiments, trenches 901 are formed in the entire device structure 320 and in at least a portion of substrate 210.

Layer 322 is etched to a level 902. Level 902 is any level above surface 212 of substrate 210. In embodiments represented by FIG. 9, device structure 320 is etched such that the etching process penetrates through layers 326 and 324 and partially into layer 324 and stopping at level 902. In some embodiments, device structure 320 is etched such that level 902 can be anywhere in device structure 320. In other embodiments, the etching process penetrates through all layers 322, 324, and 326 and stops at or below surface 212 of substrate 210. The level at which the etching process etches into device structure 320 depends on what will be formed after device structure 320 is etched. For example, device structure 320 is etched to one level if conductive interconnects will be formed and device structure 320 is etched to another level if a component such as a capacitor will be formed.

Figure 10:
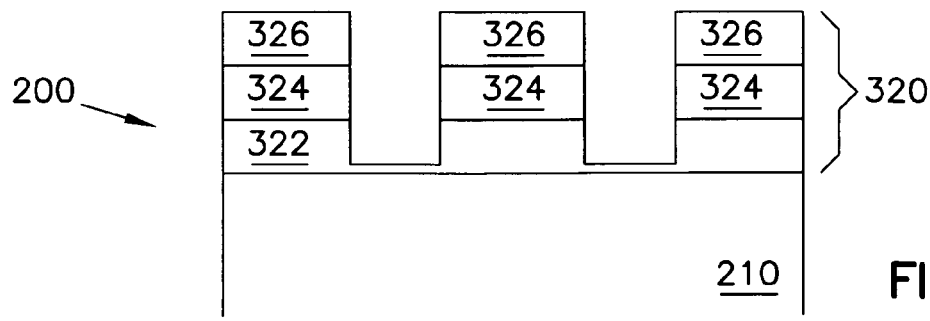

FIG. 10 shows device 100 after amorphous carbon layer 430 is removed. In some embodiments, amorphous carbon layer 430 is removed using an ash process with oxygen plasma. In other embodiments, amorphous carbon layer 430 is removed using an ash process with a combination of oxygen plasma and $CF_4$.

In the above description of FIG. 4A through FIG. 10, amorphous carbon layer 430, which is transparent in visible light range, is included in masking structure 560 to use as a mask to etch device structure 320. In some embodiments, an amorphous carbon layer such as amorphous carbon layer 430 is also included in device structure 320. For example, one of the layers 322, 324, and 326 of device structure 320 may be an amorphous carbon layer such as amorphous carbon layer 430. As another example, device structure 320 may include an additional layer besides layer 322, 324, and 326 in which the additional layer is an amorphous carbon layer such as amorphous carbon layer 430.

In embodiments where an amorphous carbon layer exists within device structure 320, the amorphous carbon layer within device structure 320 may be used for insulating purposes, antireflection purposes, or for other purposes. Hence, in embodiments where device structure 320 includes an amorphous carbon layer similar to amorphous carbon layer 430, the amorphous carbon layer of device structure 320 still remains in device 200 after amorphous carbon layer 430 of masking structure 560 is removed from device 200.

After amorphous carbon layer 430 is removed as shown in FIG. 10, other processes can be performed to device 200 to form components such as transistors, capacitors, memory cell, or an integrated circuit such as a memory device, a processor, an application specific integrated circuit, or other types of integrated circuits.

Figure 11:
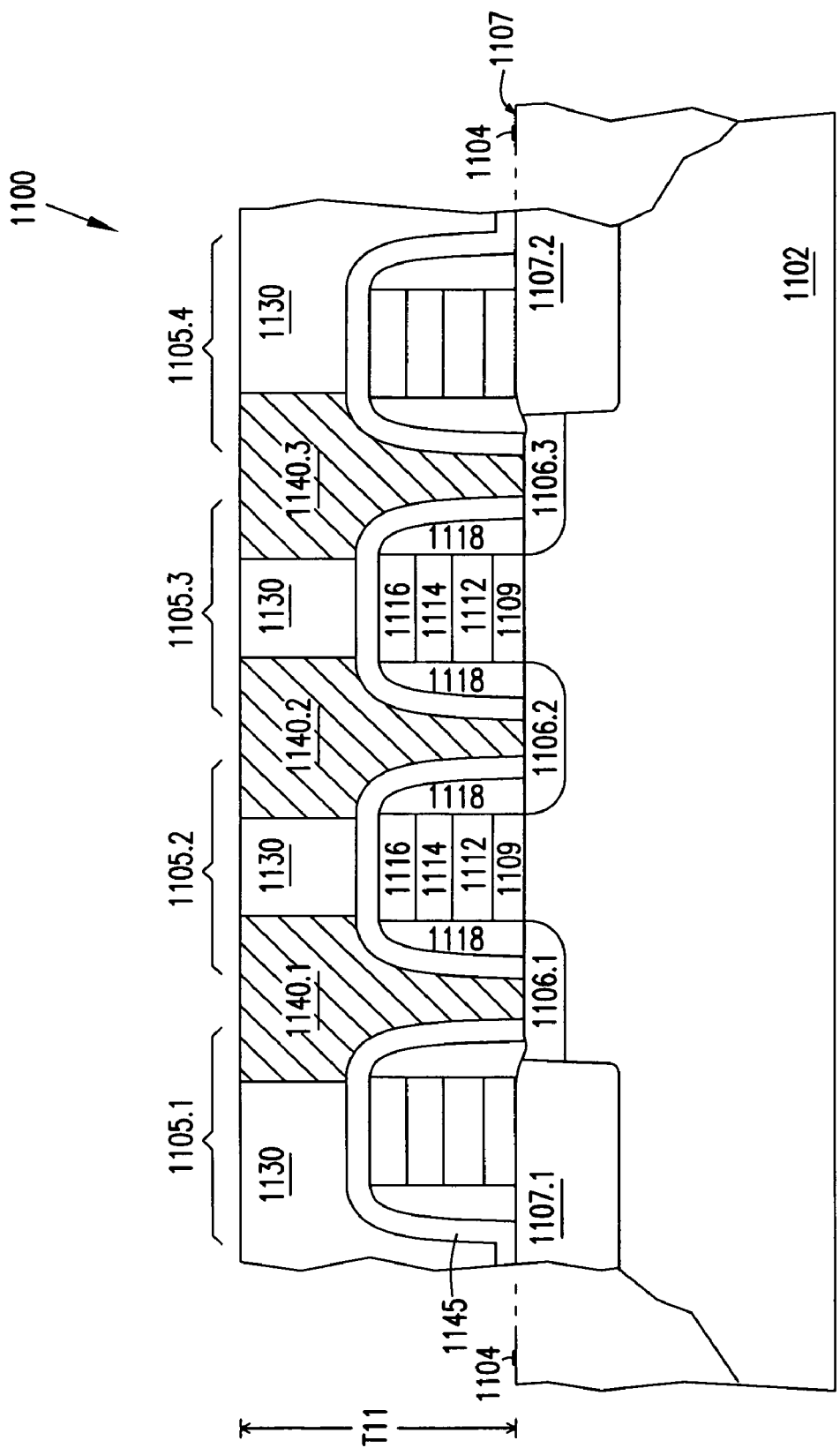
FIG. 11 through FIG. 19 show cross-sections of a memory device during various processing stages according to embodiments of the invention.

FIG. 11 through FIG. 19 show cross-sections of a memory device 1100 during various processing stages according to embodiments of the invention. In FIG. 11, memory device 1100 includes a substrate 1102 having alignment marks 1104 formed on surface 1107 of substrate 1102. A number of surface structures (gate structures) 1105 (1105.1 through 1105.4) are formed over substrate 1102. Within substrate 1102, a number of diffusion regions 1106 (1106.1 through 1106.3) and isolation structures 1107.1 and 1107.2 are formed. For clarity, FIG. 11 shows alignment marks 1104 without elements formed above alignment marks 1104. However, elements such as the layers shown in FIG. 11 may be formed over alignment marks 1104.

Memory device 1100 also includes an insulating layer 1130 and a number of contacts 1140 (1140.1 through 1140.3) extending through insulating layer 1130. Each of the contacts 1140 connects to one of the diffusion regions 1106. A barrier layer 1145 separates surface structures 1105 from insulating layer 1130 and contacts 1140. Contacts 1140 are made of conducting material to provide electrical connections for diffusion regions 1106. Barrier layer 1145 can be oxide, or nitride, or other non-conducting materials to prevent cross-diffusion of materials between surface structures 1105 and insulating layer 1130. In some embodiments, barrier layer 1145 is omitted. Insulating layer 1130 provides insulation between the contacts 1140. Insulating layer 1130 can be a layer of silicate glass doped with one or more dopants such as boron and phosphorous or other types of doped glasses. For example, insulating layer 1130 can be Boronsilicate glass (BSG), or Phosphosilicate glass (PSG). In embodiments represented by FIG. 11, insulating layer 1130 includes Borophosphosilicate glass (BPSG) and has a thickness T11. In some embodiments, T11 is in the range of 3000 Angstroms to 5000 Angstroms.

In embodiments represented by FIG. 11, substrate 1102 includes silicon doped with a dopant, for example boron, to make it a P-type material. Diffusion regions 1106 are doped with a dopant, for example phosphorous, to make them an N-type material. In some embodiments, substrate 1102 can be an N-type material and diffusion regions 1106 can be a P-type material.

Each of the gate structures 1105 includes a number of elements: a gate dielectric (gate oxide) 1109, a doped polysilicon layer 1112, a silicide layer 1114, a capping dielectric layer 1116, and dielectric spacers 1118. Silicide layer 1114 can include a compound of metal and silicon such as titanium silicide, tungsten silicide, and others. All dielectrics in gate structures 1105 can include material such as silicon oxide. Each of the gate structures 1105 is also referred to as a word line. The structure of FIG. 11 can be formed using known techniques.

Figure 12:
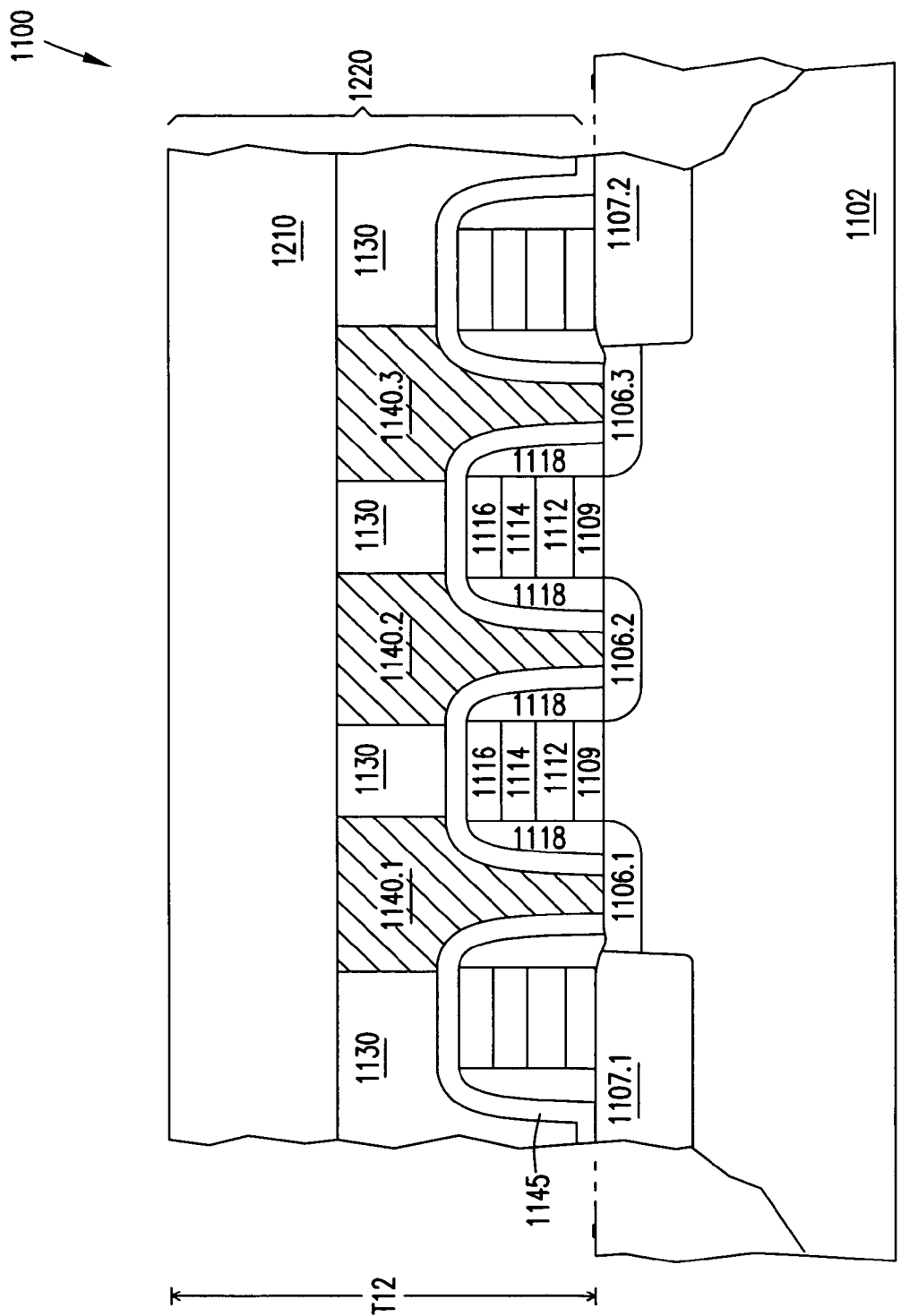

FIG. 12 shows memory device 1100 after an insulating layer 1210 is formed. Insulating layer 1210 can include BSG, PSG, or BPSG similar to insulating layer 1130. Insulating layer 1210 and other structures in FIG. 12 form a device structure 1220. Device structure 1220 has a thickness T12. In some embodiments, T12 is at least 40000 Angstroms.

Figure 13:
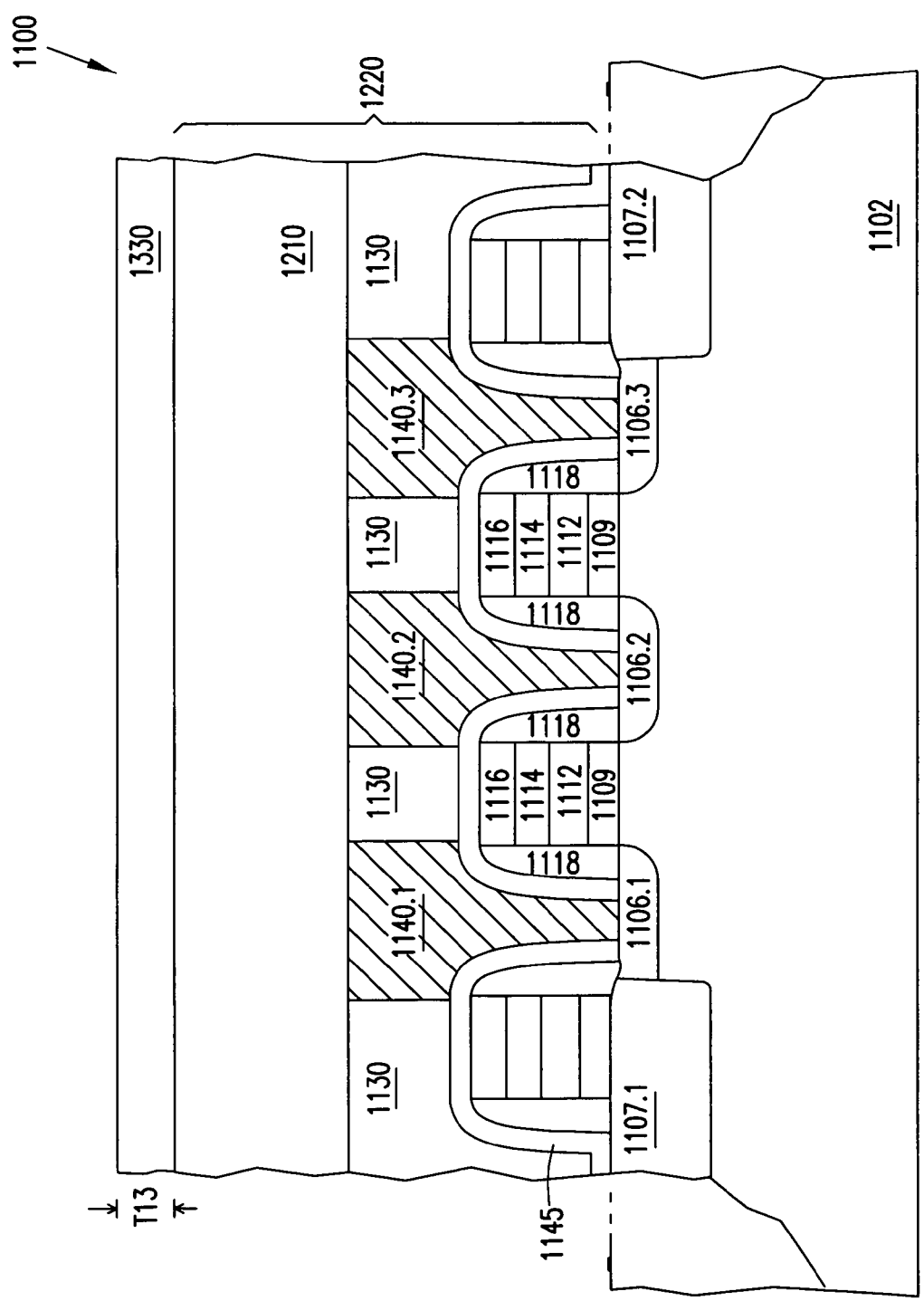

FIG. 13 shows memory device 1100 after an amorphous carbon layer 1330 is formed over device structure 1220. Amorphous carbon layer 1330 has a low absorption coefficient such that amorphous carbon layer 1330 is transparent in visible light range. In some embodiments, amorphous carbon layer 1330 has an absorption coefficient (k) between about 0.15 and about 0.001 at wavelength of 633 nm. Amorphous carbon layer 1330 may be formed by a method similar to method 100 described in FIG. 1A.

Since amorphous carbon layer 430 is transparent in visible light range, amorphous carbon layer 1330 may be formed at a selected thickness to properly etch device structure 1220 without substantially affecting the reading of the alignment marks 1104 during an alignment of device 1100. Amorphous carbon layer 1330 has a thickness T13, which can be selected at an appropriate value to properly etch device structure 1220. T13 can be any thickness. In some embodiments, T13 is at least 4000 Angstroms.

Figure 14:
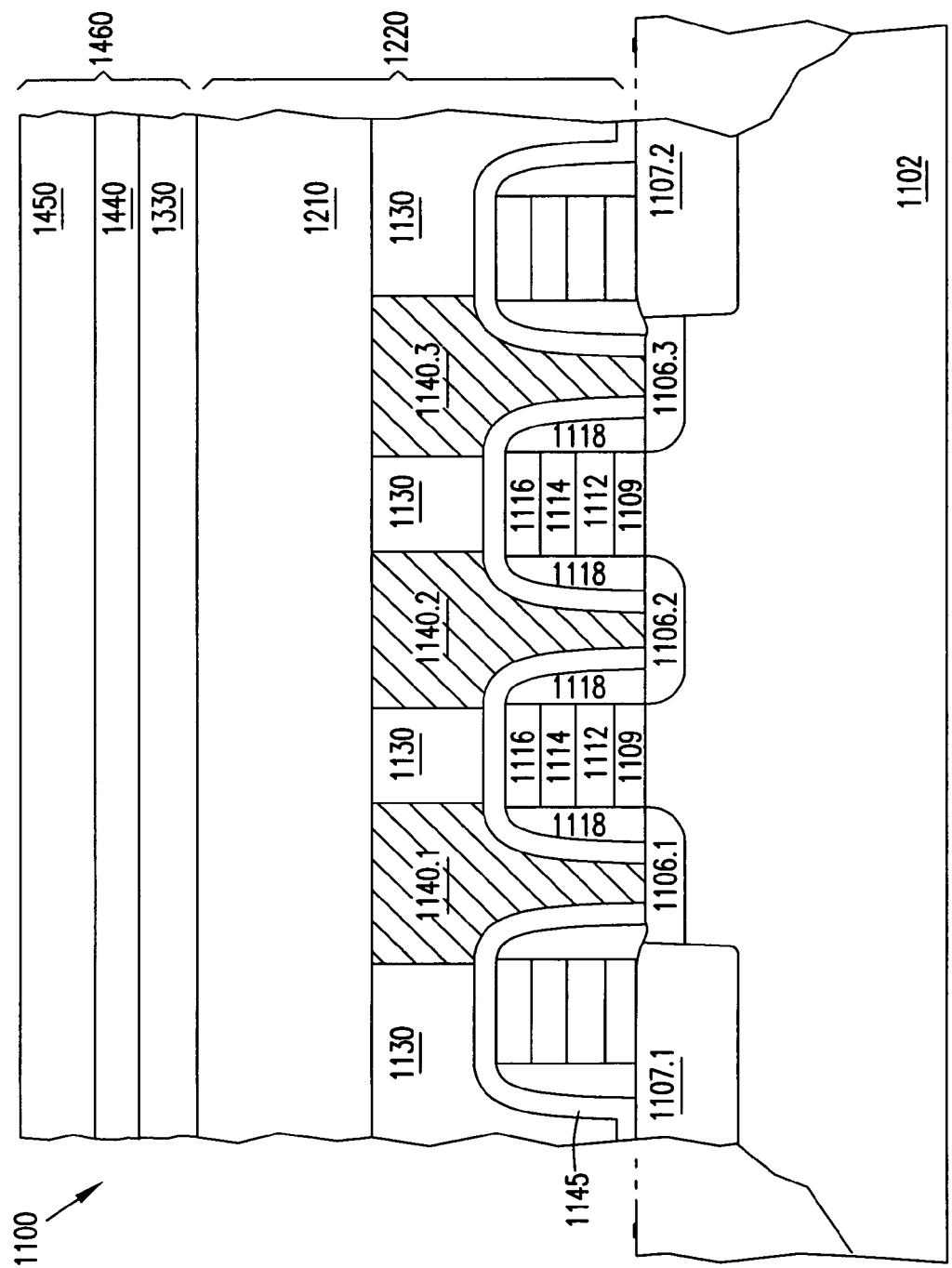

FIG. 14 shows memory device 100 after a cap layer 1440 and a photoresist layer 1450 are formed over amorphous carbon layer 1330. In some embodiments, cap layer 1440 includes oxide materials. In other embodiments, cap layer 1440 includes non-oxide materials. In FIG. 14, cap layer 1440 includes silicon oxynitride ($Si_xO_yN_z$) or silicon-rich oxide ($Si_xO_y$) where x, y, and z are real numbers. In some embodiments, cap layer 1440 includes hydrogenated silicon oxynitride ($Si_xO_yN_z$:H) or hydrogenated silicon-rich oxide ($Si_xO_y$:H). Layers 1440 and 1450 are formed using known techniques. Amorphous carbon layer 1330, cap layer 1440, and photoresist layer 1450 form a masking structure 1460. In some embodiments, cap layer 1440 is omitted from masking structure 1460. In other embodiments, masking structure 1460 further includes an additional layer formed between photoresist layer 1450 and cap layer 1440. The additional layer serves as an antireflective layer to further enhance the photo processing performance.

Figure 15:
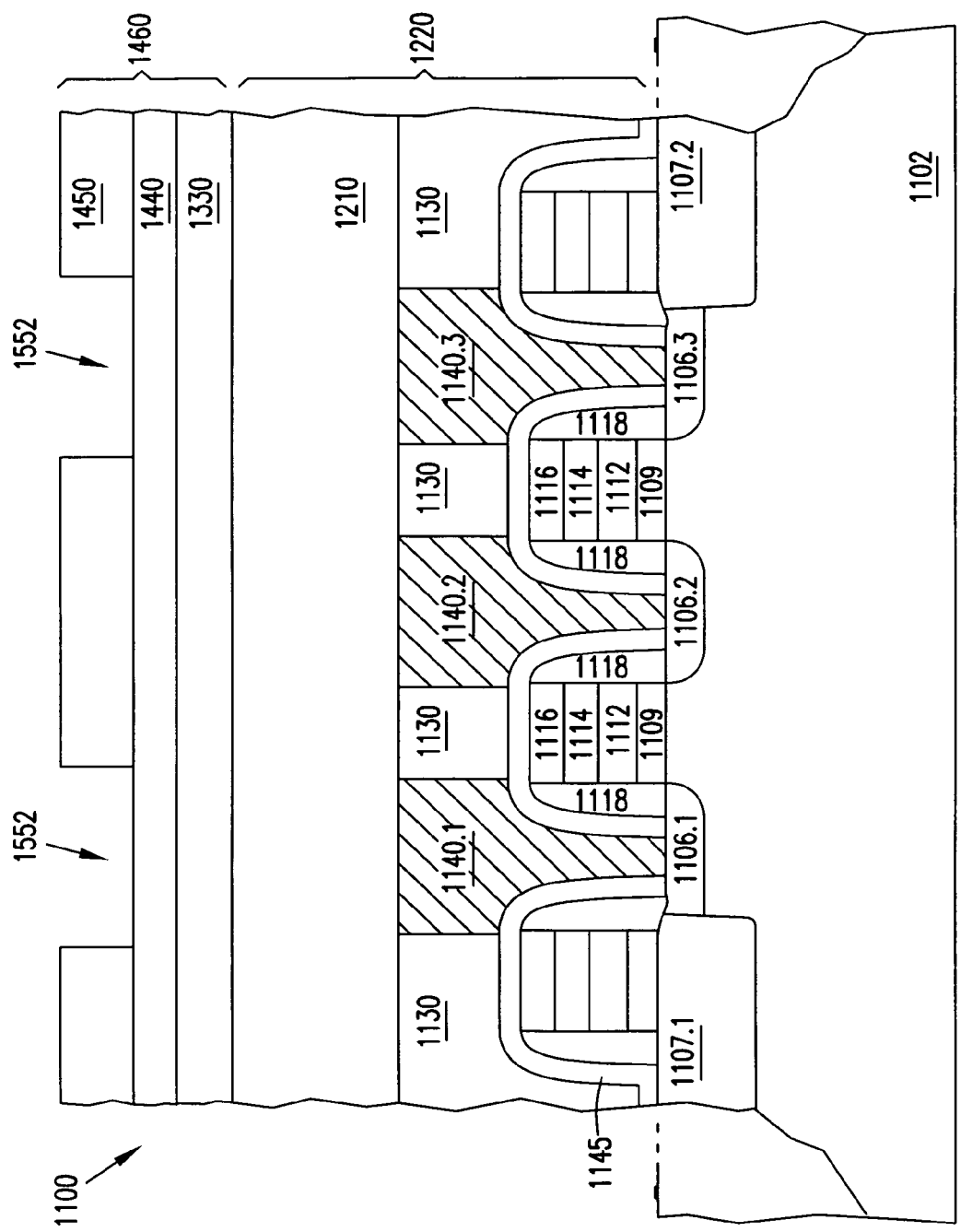

FIG. 15 shows device 1100 after photoresist layer 1450 is patterned. Patterning photoresist layer 1450 can be performed using known techniques. Patterned photoresist layer 1450 includes openings 1552.

Figure 16:
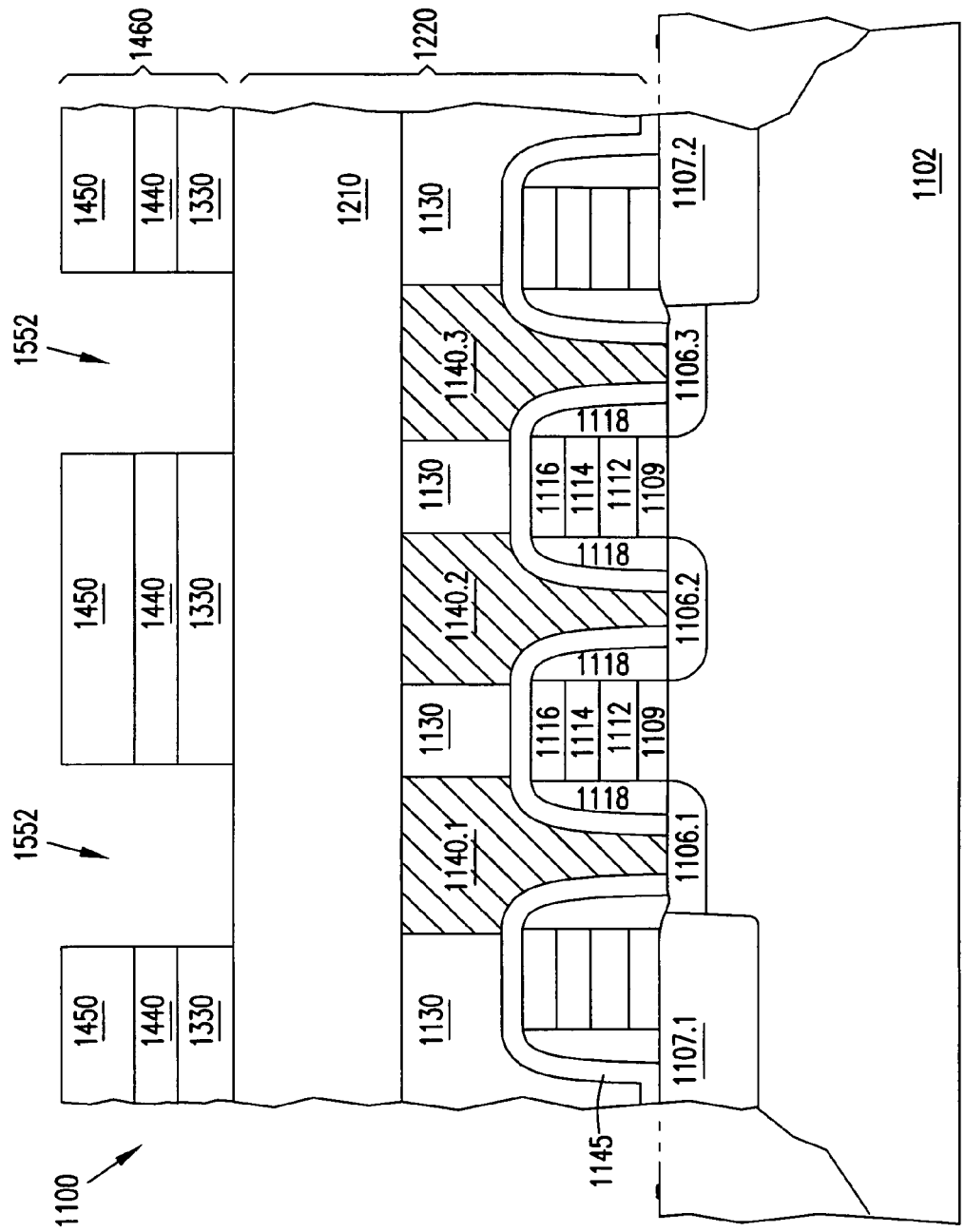

FIG. 16 shows device 1100 after masking structure 1460 is patterned. Patterning masking structure 1460 can be performed by one or more etching steps. In some embodiments, cap layer 1440 and amorphous carbon layer 1330 are etched together in one etching step. In other embodiments, cap layer 1440 and amorphous carbon layer 1330 are etched separately in different etching steps. As shown in FIG. 16, after patterning, each of the patterned cap layer 1440 and the patterned amorphous carbon layer 1330 includes openings that are continuous and aligned with openings 1552 of photoresist layer 1450.

In some embodiments, after amorphous carbon layer 1330 is patterned, the combination of layers 1330, 1440, and 1450 of masking structure 1460 may remain and is used as a mask to etch the layers of device structure 1220. In other embodiments, after amorphous carbon layer 1330 is patterned, either photoresist layer 1450 or a combination of both photoresist layer 1450 and cap layer 1440 is removed. The remaining (not removed) layer, or layers, of masking structure 1220 is used as a mask to etch device structure 1220.

Figure 17:
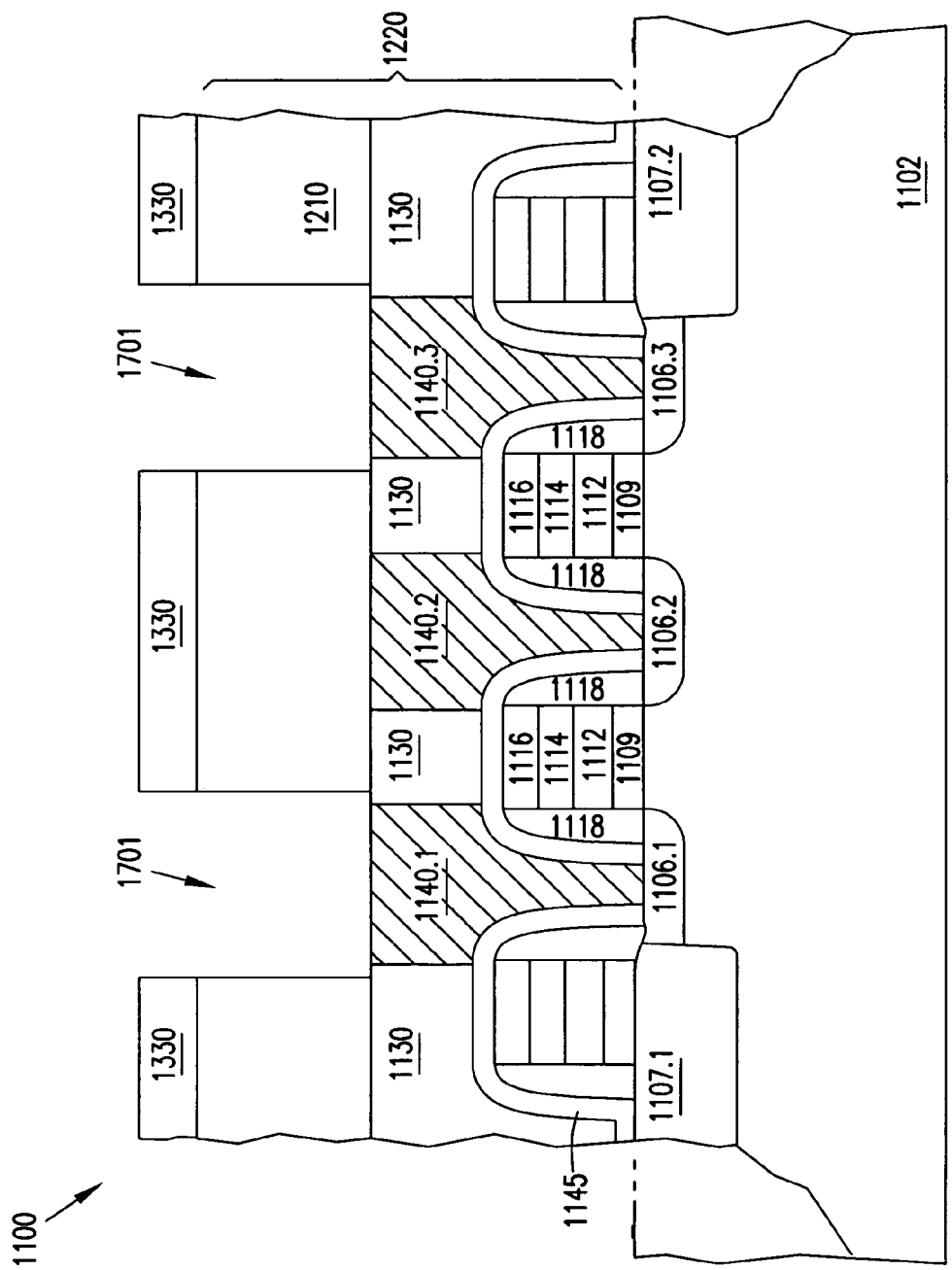

FIG. 17 shows device 1100 after device structure 1220 is etched. In embodiments represented by FIG. 16, both photoresist layer 1450 and cap layer 1440 are removed before device structure 1220 is etched. Amorphous carbon layer 1330 is used as a mask to etch the layers of device structure 1220. The etched device structure 1220 has openings 1701.

Figure 18:
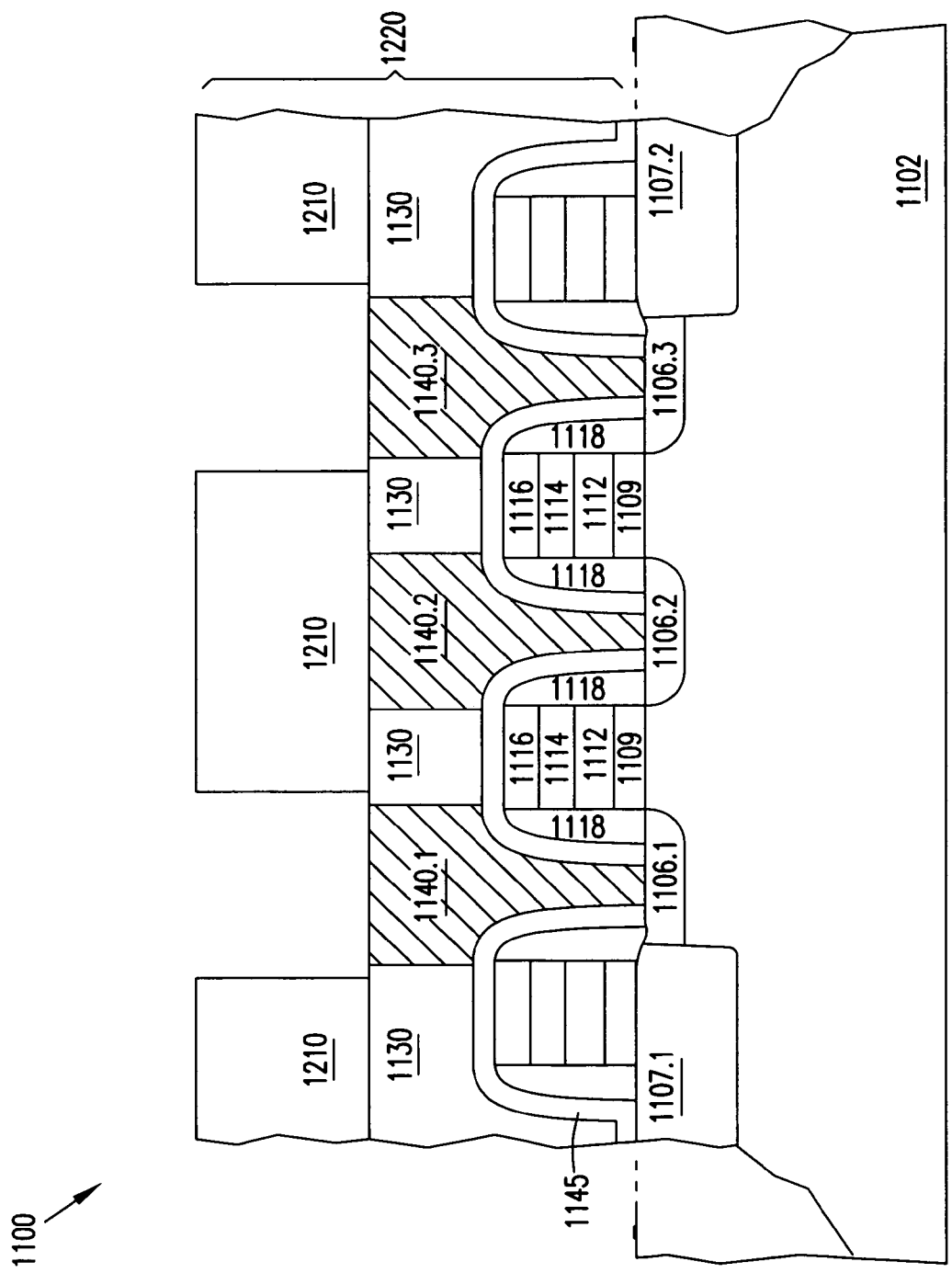

FIG. 18 shows device 1100 after amorphous carbon layer 1330 is removed. In some embodiments, amorphous carbon layer 1330 is removed using an ash process with oxygen plasma. In other embodiments, amorphous carbon layer 1330 is removed using an ash process with a combination of oxygen plasma and $CF_4$.

Figure 19:
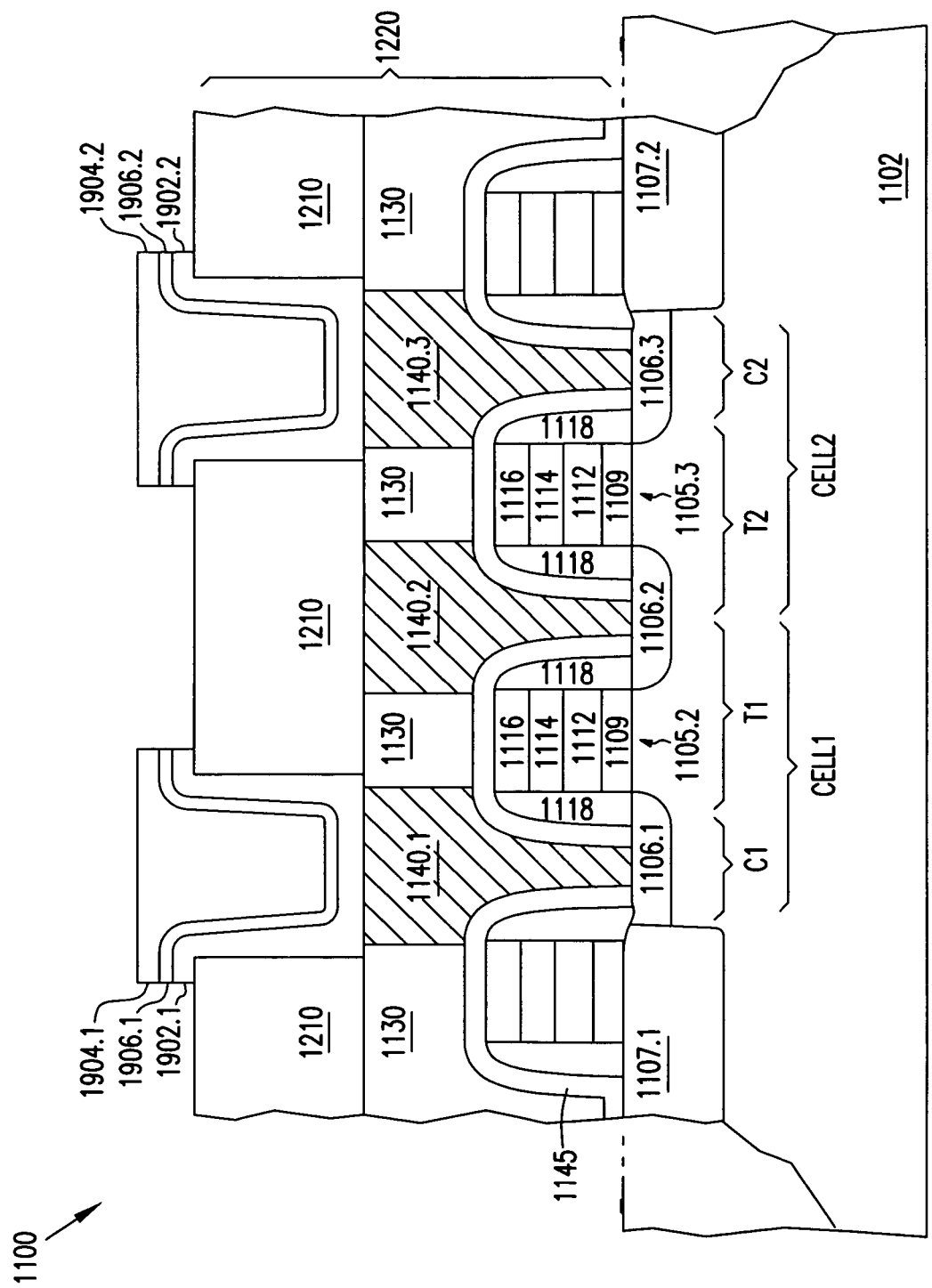

FIG. 19 shows device 1100 after other layers are formed using known techniques. In each of the openings 1552, a first conductive layer 1902 (1902.1 and 1902.2), a second conductive layer 1904 (1904.1 and 1904.2), and a dielectric layer 1906 (1906.1 and 1906.2) are formed. Conductive layers 1902, 1904, dielectric layer 1906 and other elements form storage capacitors C1 and C2. For example, in storage capacitor C1, conductive layer 1902.1, contact 1140.1, and diffusion region 1106.1 form a first capacitor plate (bottom plate); conductive layer 1902.2 forms a second capacitor plate (top plate); and dielectric layer 1906.1 is the capacitor dielectric. In some embodiments, conductive layers 1904 connect to a common cell plate of memory device 1100. The common cell plate is omitted from FIG. 19 for simplicity.

Memory device 1110 includes access transistors T1 and T2. Gate structure 1105.2 and diffusion regions 1106.1–1106.2 form access transistor T1. Gate structure 1105.3 and diffusion regions 1106.2–1106.3 form access transistor T2. Access transistor T1 and storage capacitor C1 form a memory CELL1. Access transistor T2 and storage capacitor C2 form a memory CELL2.

Memory cells CELL1 and CELL2 store data in form of charge in storage capacitors C1 and C2. The charges are transferred to and from doped regions 1106.1 and 1106.3 of capacitors C1 and C2 via contact 1140.2. In some embodiments, contact 1140.2 is a buried bit line contact, which connects to a bit line of memory device 1100.

In other embodiments, other elements having structures different from the structures of the layers 1902, 1904, and 1906 can be formed in openings 1701 (FIG. 17). For example, interconnects instead of capacitor plates can be formed in openings 1552 to connect diffusion regions 1106 to other parts of memory device 1100.

Memory device 1100 may be a dynamic random access memory (DRAM) device. Examples of DRAM devices include synchronous DRAM commonly referred to as SDRAM, SDRAM II, SGRAM (Synchronous Graphics Random Access Memory), DDR SDRAM (Double Data Rate SDRAM), DDR II SDRAM, DDR III SDRAM, GDDR III SDRAM (Graphic Double Data Rate), and Rambus DRAMs. Memory device 1100 includes other elements, which are not shown for clarity.

Figure 20:
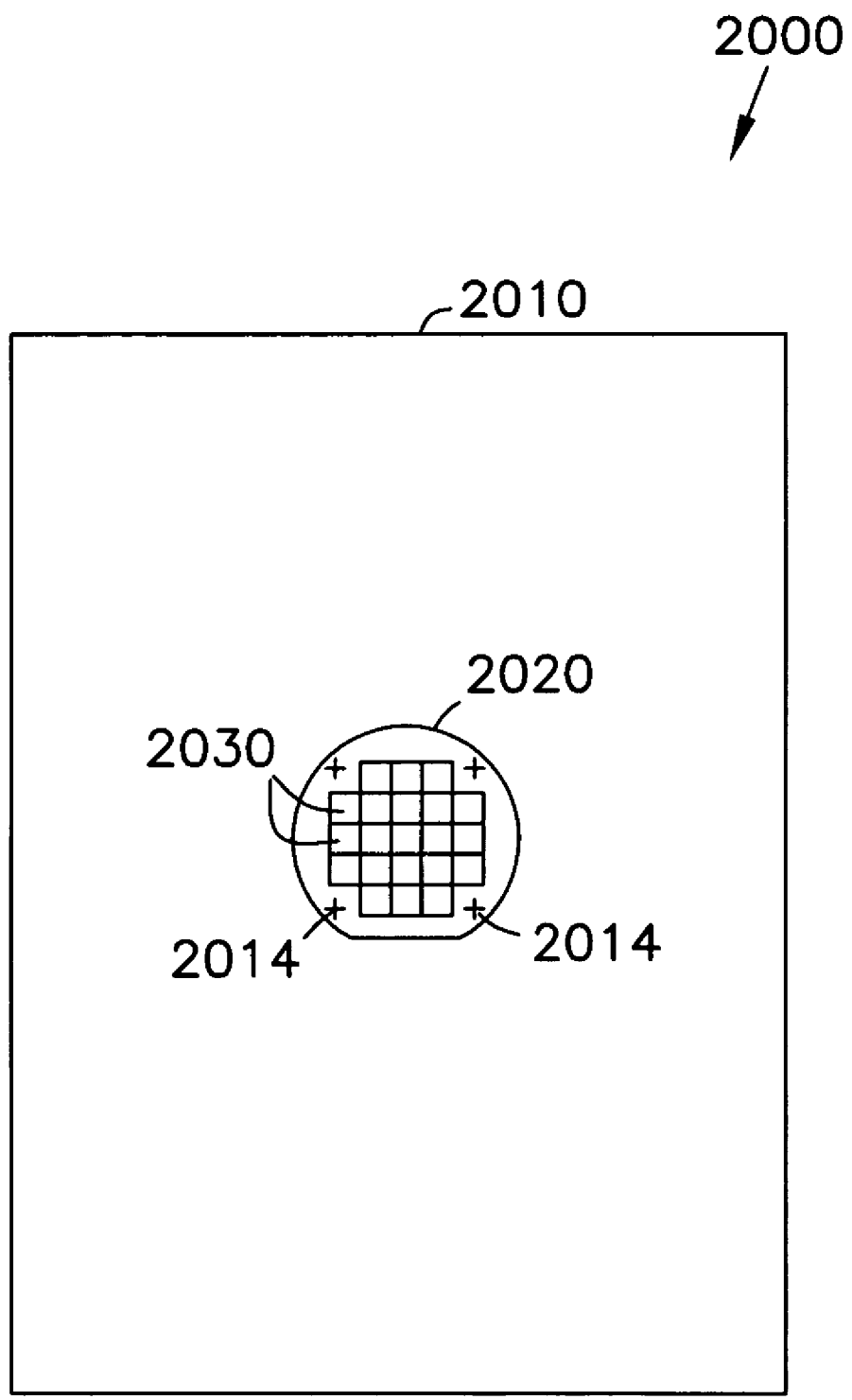
FIG. 20 shows a system according to an embodiment of the invention.

FIG. 20 shows a system according to an embodiment of the invention. System 2000 includes a chamber 2010 and a wafer 2020 placed in the chamber. In some embodiments, chamber 2010 is a PECVD chamber and wafer 2020 is a semiconductor wafer. An example of chamber 2010 includes a chamber of the Producer Processor available from Applied Materials, Inc. located in Santa Clara, Calif. Chamber 2010 and wafer 2020 can be used in method 100 described in FIG. 1A to form the transparent amorphous carbon layer according to method 100.

Wafer 2020 includes a number of alignment marks 2014 and a number of dice 2030. In some embodiments, alignment marks 2014 represent alignment marks 214 (FIG. 2) and alignment marks 1104 (FIG. 11).

At least one of the dice 2030 includes elements according to embodiments described in FIG. 2–FIG. 19 above. For example, at least one of the dice 2030 includes a substrate, a device structure, and a masking structure such as those of devices 200 and 1100 (FIG. 2–FIG. 19). Thus, at least one of the dice 2030 includes an amorphous carbon layer such as amorphous carbon layer 430 (FIG. 4A) and amorphous carbon layer 1330 (FIG. 13) formed according to the process described in FIG. 2–FIG. 19.

A die such as one of the dice 2030 is a pattern on a semiconductor wafer such as wafer 2020. A die contains circuitry to perform a specific function. For, example, at least one of the dice 2030 contains circuitry for a device such as a processor, or memory device such as memory device 1100 (FIG. 11–FIG. 19).

CONCLUSION

Various embodiments of the invention provide technique to form a transparent amorphous carbon layer. The transparent amorphous carbon layer can be used as a mask for etching certain structure of the device. The amorphous carbon layer can also be a part of a structure of the device for other purposes. Although specific embodiments are described herein, those skilled in the art recognize that other embodiments may be substituted for the specific embodiments shown to achieve the same purpose. This application covers any adaptations or variations of the present invention. Therefore, the present invention is limited only by the claims and all available equivalents.

What is claimed is:

1. An apparatus comprising:
a semiconductor wafer including at least one alignment mark;
a device structure formed over the semiconductor wafer; and
a masking structure formed over the device structure, the masking structure including an amorphous carbon layer, wherein the amorphous carbon layer is transparent in visible light range for allowing a reading of the alignment mark in the visible light range.

2. The apparatus of claim 1, wherein the amorphous carbon layer has an absorption coefficient between about 0.15 and about 0.001 at wavelength of 633 nanometers.

3. The apparatus of claim 1, wherein the visible light range includes electromagnetic radiation having wavelengths between 400 nanometers and 700 nanometers.

4. The apparatus of claim 1, wherein the amorphous carbon layer has a thickness greater than 4000 Angstroms.

5. The apparatus of claim 4, wherein the device structure has a thickness greater than 40000 Angstroms.

6. The apparatus of claim 1, wherein the masking structure further includes a silicon oxynitride layer formed over the amorphous carbon layer.

7. The apparatus of claim 1, wherein the masking structure further includes a photoresist layer.

8. The apparatus of claim 7, wherein the masking structure further includes an antireflective layer.

9. The apparatus of claim 7 wherein the photoresist layer includes at least one opening.

10. The apparatus of claim 9, wherein the amorphous carbon layer includes at least one opening continuous with the at least one opening of the photoresist layer.

11. The apparatus of claim 1, wherein the device structure includes a layer of a conducting material.

12. The apparatus of claim 11, wherein the device structure further includes an amorphous carbon layer, wherein the amorphous carbon layer of the device structure is transparent in visible light range.

13. The apparatus of claim 1, wherein the masking structure further comprises an antireflective layer, and wherein the antireflective layer is directly contacting the amorphous carbon layer.

14. The apparatus of claim 1, wherein the masking structure comprises a silicon oxide layer, and wherein the silicon oxide layer is directly contacting the amorphous carbon layer.

15. The apparatus of claim 14, wherein the masking structure further comprises a photoresist layer, and wherein the photoresist layer is directly contacting the silicon oxide layer.

16. The apparatus of claim 1, wherein the masking structure further comprises a hydrogenated silicon oxide layer, and wherein the hydrogenated silicon oxide layer is directly contacting the amorphous carbon layer.

17. The apparatus of claim 16, wherein the masking structure further comprises a photoresist layer, and wherein the photoresist layer is directly contacting the hydrogenated silicon oxide layer.

18. The apparatus of claim 1, wherein the masking structure further comprises a silicon oxynitride layer, and wherein the silicon oxynitride layer is directly contacting the amorphous carbon layer.

19. The apparatus of claim 18, wherein the masking structure further comprises a photoresist layer, and wherein the photoresist layer is directly contacting the silicon oxynitride layer.

20. The apparatus of claim 1, wherein the masking structure further comprises a hydrogenated silicon oxynitride layer, and wherein the hydrogenated silicon oxynitride layer is directly contacting the amorphous carbon layer.

21. The apparatus of claim 20, wherein the masking structure further comprises a photoresist layer, wherein the photoresist layer is directly contacting the hydrogenated silicon oxynitride layer.

22. A mask structure for a device, the mask structure comprising:
an amorphous carbon layer formed over a semiconductor wafer, the semiconductor wafer including at least one alignment mark, wherein the amorphous carbon layer is transparent to radiation having wavelengths between 400 nanometers and 700 nanometers for allowing a reading of alignment marks in the semiconductor wafer in the wavelengths between 400 nanometers and 700 nanometers.

23. The mask structure of claim 22, wherein the amorphous carbon layer has an absorption coefficient between about 0.15 and about 0.001 at wavelength of 633 nanometers.

24. The mask structure of claim 22, wherein the amorphous carbon layer has a thickness of at least 4000 Angstroms.

25. The mask structure of claim 22 further comprising a photoresist layer.

26. The mask structure of claim 25 further comprising a cap layer formed over the amorphous carbon layer.

27. The mask structure of claim 26, wherein the cap layer includes silicon oxynitride.

28. The mask structure of claim 25, wherein the photoresist layer includes at least one opening.

29. The mask structure of claim 28, wherein the amorphous carbon layer includes at least one opening continuous with the at least one opening of the photoresist layer.

30. The mask structure of claim 22 further comprising an antireflective layer, and wherein the antireflective layer is directly contacting the amorphous carbon layer.

31. The mask structure of claim 22 further comprising a silicon oxide layer, wherein the silicon oxide layer is directly contacting the amorphous carbon layer.

32. The mask structure of claim 31 further comprising a photoresist layer, wherein the photoresist layer is directly contacting the silicon oxide layer.

33. The mask structure of claim 22 further comprising a hydrogenated silicon oxide layer, wherein the hydrogenated silicon oxide layer is directly contacting the amorphous carbon layer.

34. The mask structure of claim 33 further comprising a photoresist layer, wherein the photoresist layer is directly contacting the hydrogenated silicon oxide layer.

35. The mask structure of claim 22 further comprising a silicon oxynitride layer, wherein the silicon oxynitride layer is directly contacting the amorphous carbon layer.

36. The mask structure of claim 35 further comprising a photoresist layer, wherein the photoresist layer is directly contacting the silicon oxynitride layer.

37. The mask structure of claim 22 further comprising a hydrogenated silicon oxynitride layer, wherein the hydrogenated silicon oxynitride layer is directly contacting the amorphous carbon layer.

38. The mask structure of claim 37 further comprising a photoresist layer, wherein the photoresist layer is directly contacting the hydrogenated silicon oxynitride layer.

39. The apparatus of claim 1, wherein the device structure includes a layer of a non-conducting material.

40. The apparatus of claim 39, wherein the device structure further includes a layer of a conducting material.

* * * * *